(12) United States Patent
Song

(10) Patent No.: US 11,276,451 B2
(45) Date of Patent: Mar. 15, 2022

(54) ERROR CORRECTION METHODS AND SEMICONDUCTOR DEVICES AND SEMICONDUCTOR SYSTEMS USING THE SAME

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/943,788

(22) Filed: Jul. 30, 2020

(65) Prior Publication Data

US 2021/0304807 A1    Sep. 30, 2021

(30) Foreign Application Priority Data

Mar. 31, 2020 (KR) .......... 10-2020-0039316

(51) Int. Cl.
G11C 7/00 (2006.01)
G11C 11/406 (2006.01)
G11C 11/4096 (2006.01)

(52) U.S. Cl.
CPC ........ G11C 11/406 (2013.01); G11C 11/4096 (2013.01); G11C 2211/4062 (2013.01)

(58) Field of Classification Search
CPC .............. G11C 11/406; G11C 11/4096; G11C 2211/4062
USPC ................................... 365/189.14
See application file for complete search history.

(56) References Cited

U.S. PATENT DOCUMENTS

| | | | |
|---|---|---|---|
| 10,037,246 | B1 | 7/2018 | Laws et al. |
| 2017/0068584 | A1* | 3/2017 | Park ................. G11C 29/50016 |
| 2017/0242749 | A1* | 8/2017 | Park ................. G11C 11/40611 |
| 2019/0285667 | A1* | 9/2019 | Milano ............. G01R 19/0092 |
| 2019/0385667 | A1* | 12/2019 | Morohashi ........ G11C 11/40615 |

FOREIGN PATENT DOCUMENTS

| | | |
|---|---|---|
| KR | 100379812 B1 | 6/2003 |
| KR | 1020180061445 A | 6/2018 |
| KR | 1020180079495 A | 7/2018 |

* cited by examiner

*Primary Examiner* — Hoai V Ho
*Assistant Examiner* — Minh Dinh
(74) *Attorney, Agent, or Firm* — William Park & Associates Ltd.

(57) ABSTRACT

A semiconductor device includes an error correction circuit and a refresh control circuit. The error correction circuit is configured to detect an error included in internal data, to generate a failure detection signal, and to correct the error of the internal data. The refresh control circuit is configured to store an address signal for selecting the internal data in response to the failure detection signal. In addition, the refresh control circuit is configured to generate a refresh address signal for activating a word line connected to memory cells storing the internal data from the address signal when a refresh signal is inputted to the refresh control circuit by a predetermined number of times.

28 Claims, 13 Drawing Sheets

ERROR CORRECTION METHODS AND SEMICONDUCTOR DEVICES AND SEMICONDUCTOR SYSTEMS USING THE SAME

CROSS-REFERENCE TO RELATED APPLICATIONS

The present application claims priority under 35 U.S.C. 119(a) to Korean Patent Application No. 10-2020-0039316, filed on Mar. 31, 2020, which is incorporated herein by reference in its entirety.

BACKGROUND

1. Technical Field

Embodiments of the present disclosure relate to error correction methods of performing an additional refresh operation for failed internal data, and semiconductor devices and semiconductor systems using the same.

2. Related Art

Recently, various design schemes for receiving or outputting multi-bit data during individual clock cycles have been used to improve operation speeds of semiconductor devices. If a data transmission speed of a semiconductor device becomes faster, the probability of an error occurrence may increase while the data are transmitted in the semiconductor device. Accordingly, advanced design techniques may be required to guarantee the reliable transmission of data in semiconductor devices.

Whenever data are transmitted in semiconductor devices, error codes which are capable of detecting the occurrence of errors may be generated and transmitted with the data to improve the reliability of the data transmission. The error codes may include a cyclic redundancy check and an error detection code (EDC), which are capable of detecting errors, and an error correction code (ECC), which is capable of correcting the errors by itself.

Meanwhile, semiconductor devices such as DRAM devices perform a write operation and a read operation. The write operation is performed to store data into a bank including cell arrays selected by an address, and the read operation is performed to output the data stored in the cell arrays included in the bank. In addition, the semiconductor devices are designed to internally copy data having various patterns and to perform various tests using the copied data.

SUMMARY

According to an embodiment, a semiconductor device includes an error correction circuit and a refresh control circuit. The error correction circuit is configured to detect an error included in internal data, to generate a failure detection signal, and to correct the error of the internal data. The refresh control circuit is configured to store an address signal for selecting the internal data in response to the failure detection signal and is configured to generate a refresh address signal for activating a word line connected to memory cells storing the internal data from the address signal when a refresh signal is inputted to the refresh control circuit by a predetermined number of times.

According to another embodiment, a semiconductor device includes a core circuit, an error correction circuit, and a refresh control circuit. The core circuit is configured to output internal data stored in memory cells connected to a word line selected by an address signal in response to a read signal and is configured to replace a failed word line connected to at least one failed memory cell storing failed internal data with a repair line in response to a repair signal. The error correction circuit is configured to detect an error included in the failed internal data to generate a failure detection signal and is configured to correct the error of the failed internal data. The refresh control circuit is configured to generate the repair signal in response to the failure detection signal when the address signal for selecting the failed internal data is inputted by a first predetermined number of times.

According to yet another embodiment, an error correction method includes a read operation step, an error correction step, and a refresh step. The read operation step outputs internal data stored in a core circuit to an input/output line based on an address signal during a read operation. The error correction step detects an error of the internal data, latches the address signal according to the detection result of the error of the internal data, and corrects the error of the internal data to output the corrected internal data as data. The refresh step generates a refresh address signal from the address signal to refresh memory cells connected to a word line selected by the refresh address signal when a refresh signal is inputted by a predetermined number of times during a refresh operation.

According to still another embodiment, an error correction method includes a read operation step, an error correction step, and a refresh step. The read operation step outputs internal data stored in a core circuit to an input/output line based on an address signal during a read operation. The error correction step detects an error of the internal data, latches the address signal according to the detection result of the error of the internal data, and corrects the error of the internal data to output the corrected internal data as data. The refresh step generates a refresh address signal from the latched address signal to refresh memory cells connected to a word line selected by the refresh address signal when the address signal for selecting the internal data having the error is inputted by a first predetermined number of times during a refresh operation. In addition, the refresh step refreshes the word line again when the address signal for selecting the internal data having the error is inputted by a second predetermined number of times during the refresh operation.

DETAILED DESCRIPTION

In the following description of embodiments, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is being executed.

It will be understood that although the terms "first," "second," "third," etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
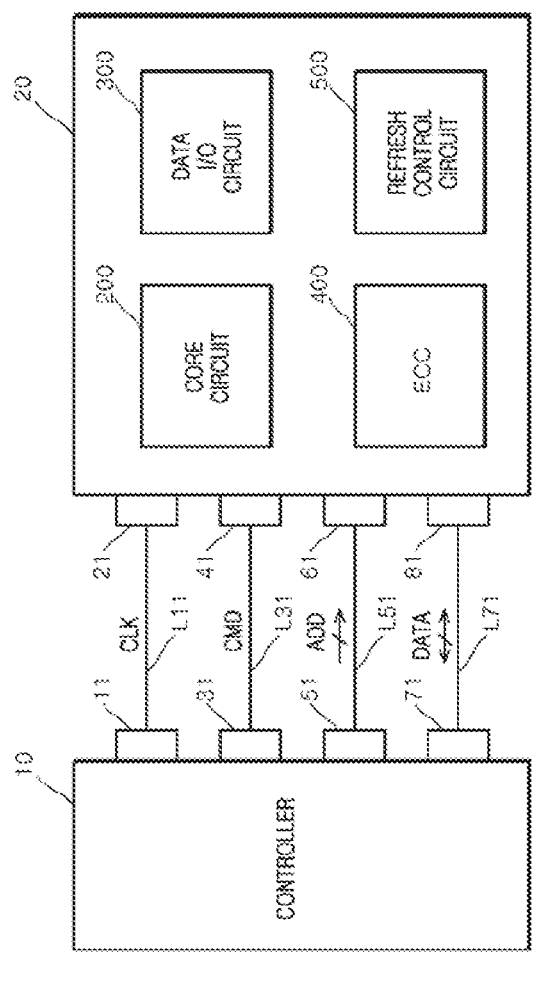
FIG. 1 is a block diagram illustrating a configuration of a semiconductor system according to an embodiment of the present disclosure.

As illustrated in FIG. 1, a semiconductor system 1 according to an embodiment of the present disclosure may include a controller and a semiconductor device 20. The semiconductor device 20 may include a core circuit 200, a data input/output (I/O) circuit 300, an error correction circuit (ECC) 400, and a refresh control circuit 500.

The controller 10 may include a first control pin 11, a second control pin 31, a third control pin 51, and a fourth control pin 71. The semiconductor device 20 may include a first semiconductor pin 21, a second semiconductor pin 41, a third semiconductor pin 61, and a fourth semiconductor pin 81. The first control pin 11 and the first semiconductor pin 21 may be connected to each other through a first transmission line L11. The second control pin 31 and the second semiconductor pin 41 may be connected to each other through a second transmission line L31. The third control pin 51 and the third semiconductor pin 61 may be connected to each other through a third transmission line L51. The fourth control pin 71 and the fourth semiconductor pin 81 may be connected to each other through a fourth transmission line L71. The controller 10 may transmit a clock signal CLK to the semiconductor device 20 through the first transmission line L11 to control the semiconductor device 20. The controller 10 may transmit a command signal CMD to the semiconductor device 20 through the second transmission line L31 to control the semiconductor device 20. The controller 10 may transmit an address signal ADD to the semiconductor device 20 through the third transmission line L51 to control the semiconductor device 20. The controller 10 may receive data DATA from the semiconductor device 20 through the fourth transmission line L71 or may transmit the data DATA to the semiconductor device 20 through the fourth transmission line L71.

The controller 10 may output the clock signal CLK, the command signal CMD, and the address signal ADD to the semiconductor device 20 to perform a read operation. The controller may receive the data DATA from the semiconductor device 20 during the read operation. The controller 10 may output the clock signal CLK, the command signal CMD, the address signal ADD, and the data DATA to the semiconductor device 20 to perform a write operation. The controller 10 may output the clock signal CLK and the command signal CMD to the semiconductor device 20 to perform a refresh operation. The command signal CMD, the address signal ADD, and the data DATA may be successively inputted or outputted in synchronization with an odd pulse or an even pulse included in the clock signal CLK.

The core circuit 200 may output the data DATA based on the command signal CMD and the address signal ADD in synchronization with the clock signal CLK during the read operation. The core circuit 200 may receive and store the data DATA based on the command signal CMD and the address signal ADD in synchronization with the clock signal CLK during the write operation. The core circuit 200 may sequentially activate multiple word lines included therein based on the command signal CMD in synchronization with the clock signal CLK during the refresh operation. The core circuit 200 may additionally activate a certain word line based on the command signal CMD in synchronization with the clock signal CLK during the refresh operation when at least one memory cell of memory cells connected to the certain word line is a failed memory cell storing internal data (ID<1:K> of FIG. 2) including an erroneous data. The core circuit 200 may perform a repair operation for replacing a word line connected to at least one failed memory cell storing the internal data (ID<1:K> of FIG. 2) including an erroneous data with a repair line.

The data input/output circuit 300 may generate the data DATA from the internal data (ID<1:K> of FIG. 2) during the read operation. The data input/output circuit 300 may generate the internal data (ID<1:K> of FIG. 2) from the data DATA during the write operation.

The error correction circuit 400 may detect an error of the internal data (ID<1:K> of FIG. 2) to generate a failure detection signal (FAIL of FIG. 2) during the read operation. The error correction circuit 400 may correct the error included in the internal data (ID<1:K> of FIG. 2) during the read operation. The error correction circuit 400 may detect an error of the internal data (ID<1:K> of FIG. 2) during the write operation to generate the failure detection signal (FAIL of FIG. 2). The error correction circuit 400 may detect the error of the internal data (ID<1:K> of FIG. 2) to correct the error included in the internal data (ID<1:K> of FIG. 2) during the write operation.

The refresh control circuit 500 may store the address signal ADD for selecting the internal data (ID<1:K> of FIG. 2) in response to the failure detection signal (FAIL of FIG. 2) during the read operation. The refresh control circuit 500 may store the address signal ADD for selecting the internal data (ID<1:K> of FIG. 2) in response to the failure detection signal (FAIL of FIG. 2) having high level during the read operation. The refresh control circuit 500 may generate a refresh address signal (REF_ADD<1:M> of FIG. 2) for sequentially activating multiple word lines during the refresh operation. The refresh control circuit 500 may generate the refresh address signal (REF_ADD<1:M> of FIG. 2) for activating a word line connected to memory cells storing the internal data (ID<1:K> of FIG. 2) from the stored address signal ADD during the refresh operation.

Figure 2:
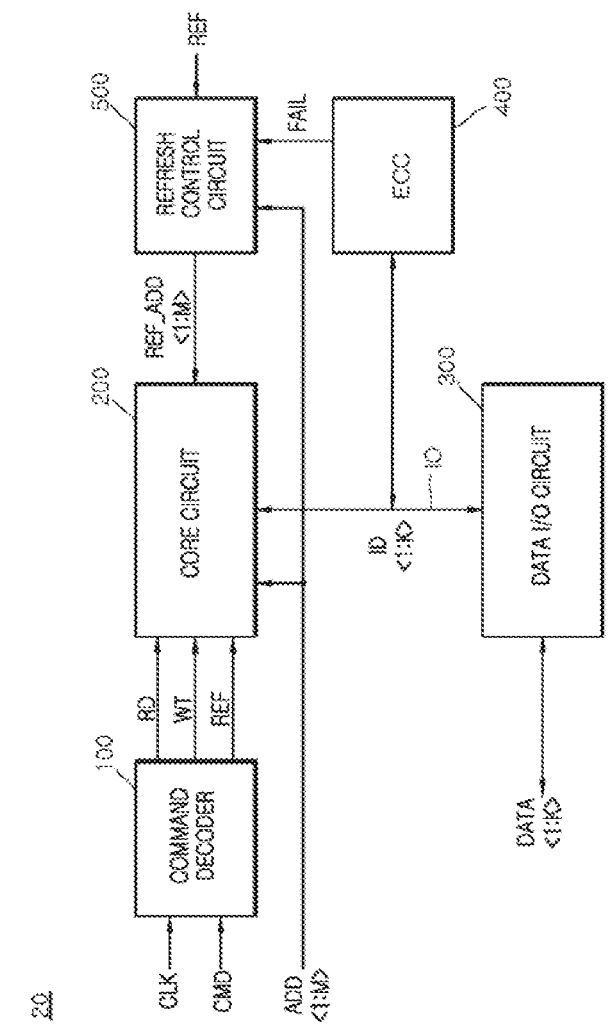
FIG. 2 is a block diagram illustrating a configuration of a semiconductor device included in the semiconductor system illustrated in FIG. 1.

FIG. 2 is a block diagram illustrating a configuration of the semiconductor device 20. As illustrated in FIG. 2, the semiconductor device 20 may include a command decoder 100, the core circuit 200, the data input/output circuit 300, the error correction circuit 400, and the refresh control circuit 500.

The command decoder 100 may be synchronized with the clock signal CLK to generate a read signal RD, a write signal WT, and a refresh signal REF, one of which is selectively enabled from the command signal CMD. The command decoder 100 may generate the read signal RD for performing the read operation by decoding the command signal CMD in synchronization with the clock signal CLK. The command decoder 100 may generate the write signal WT for performing the write operation by decoding the command signal CMD in synchronization with the clock signal CLK. The command decoder 100 may generate the refresh signal REF for performing the refresh operation by decoding the command signal CMD in synchronization with the clock signal CLK.

During the read operation, the core circuit 200 may output first to $K^{th}$ internal data ID<1:K> stored therein based on the read signal RD and first to $M^{th}$ address signals ADD<1:M>. The core circuit 200 may store the first to $K^{th}$ internal data ID<1:K> based on the write signal WT and the first to $M^{th}$ address signals ADD<1:M> during the write operation. The core circuit 200 may perform the refresh operation for activating the multiple word lines based on the refresh signal REF and first to $M^{th}$ refresh address signals REF_ADD<1:M> during the refresh operation. The first to $K^{th}$ internal data ID<1:K> may be outputted from the core circuit 200 through an input/output line IO during the read operation. The first to $K^{th}$ internal data ID<1:K> may be inputted to the core circuit 200 through the input/output line IO during the write operation.

The data input/output circuit 300 may buffer the first to $K^{th}$ internal data ID<1:K> loaded on the input/output line IO to generate the first to $K^{th}$ data DATA<1:K> during the read operation. The data input/output circuit 300 may output the first to $K^{th}$ data DATA<1:K> to the controller 10 during the read operation. The data input/output circuit 300 may buffer the first to $K^{th}$ data DATA<1:K> to generate the first to $K^{th}$ internal data ID<1:K> during the write operation. The data input/output circuit 300 may output the first to $K^{th}$ internal data ID<1:K> to the input/output line IO during the write operation. Although FIG. 2 illustrates the input/output line IO with a single line, the input/output line IO may be configured to include multiple lines.

The error correction circuit 400 may detect an error of the first to $K^{th}$ internal data ID<1:K> loaded on the input/output line IO during the read operation. The error correction circuit 400 may correct the error of the first to $K^{th}$ internal data ID<1:K> during the read operation and may output the corrected data of the first to $K^{th}$ internal data ID<1:K> to the input/output line IO. The error correction circuit 400 may generate the failure detection signal FAIL which is enabled when an error occurs in the first to $K^{th}$ internal data ID<1:K> loaded on the input/output line IO during the read operation. The error correction circuit 400 may detect the error of the first to $K^{th}$ internal data ID<1:K> loaded on the input/output line IO during the write operation. The error correction circuit 400 may correct the error of the first to $K^{th}$ internal data ID<1:K> during the write operation and may output the corrected data of the first to $K^{th}$ internal data ID<1:K> to the input/output line IO. The error correction circuit 400 may generate the failure detection signal FAIL which is enabled when an error occurs in the first to $K^{th}$ internal data ID<1:K> loaded on the input/output line IO during the write operation. The error correction circuit 400 may be realized using a general ECC circuit that corrects an error using an error correction code (ECC).

The refresh control circuit 500 may store the first to $M^{th}$ address signals ADD<1:M> for selecting the first to $K^{th}$ internal data ID<1:K> in response to the failure detection signal FAIL during the read operation. The refresh control circuit 500 may store the first to $M^{th}$ address signals ADD<1:M> for selecting the first to $K^{th}$ internal data ID<1:K> in response to the failure detection signal FAIL during the write operation. The refresh control circuit 500 may generate the first to $M^{th}$ refresh address signals REF_ADD<1:M> for sequentially activating the multiple word lines based on the refresh signal REF. During the refresh operation, when the refresh signal REF is inputted by a first predetermined number of times, the refresh control circuit 500 may generate the first to $M^{th}$ refresh address signals REF_ADD<1:M> for activating a word line connected to at least one memory cell storing the first to $K^{th}$ internal data ID<1:K> having an erroneous data, from the first to $M^{th}$ address signals ADD<1:M>. A case that the refresh signal REF is inputted by the first predetermined number of times may be set as a case that the refresh signal REF is inputted two times or more. The first predetermined number of times may be set as a case that the refresh signal REF is successively inputted in various ways according to embodiments.

The semiconductor device 20 may be synchronized with the clock signal CLK to generate the first to $K^{th}$ data DATA<1:K> from the first to $K^{th}$ internal data ID<1:K> stored therein and to output the first to $K^{th}$ data DATA<1:K> to the controller 10 during the read operation. The semiconductor device 20 may receive the first to $K^{th}$ data DATA<1:K> from the controller 10 in synchronization with the clock signal CLK to generate and store the first to $K^{th}$ internal data ID<1:K> during the write operation. The semiconductor device 20 may sequentially activate the multiple word lines based on the first to $M^{th}$ refresh address signals REF_ADD<1:M> during the refresh operation. During the refresh operation, when the refresh signal REF is generated by the first predetermined number of times, the semiconductor device 20 may additionally activate a word line connected to at least one memory cell storing the first to $K^{th}$ internal data ID<1:K> including an erroneous data.

Figure 3:
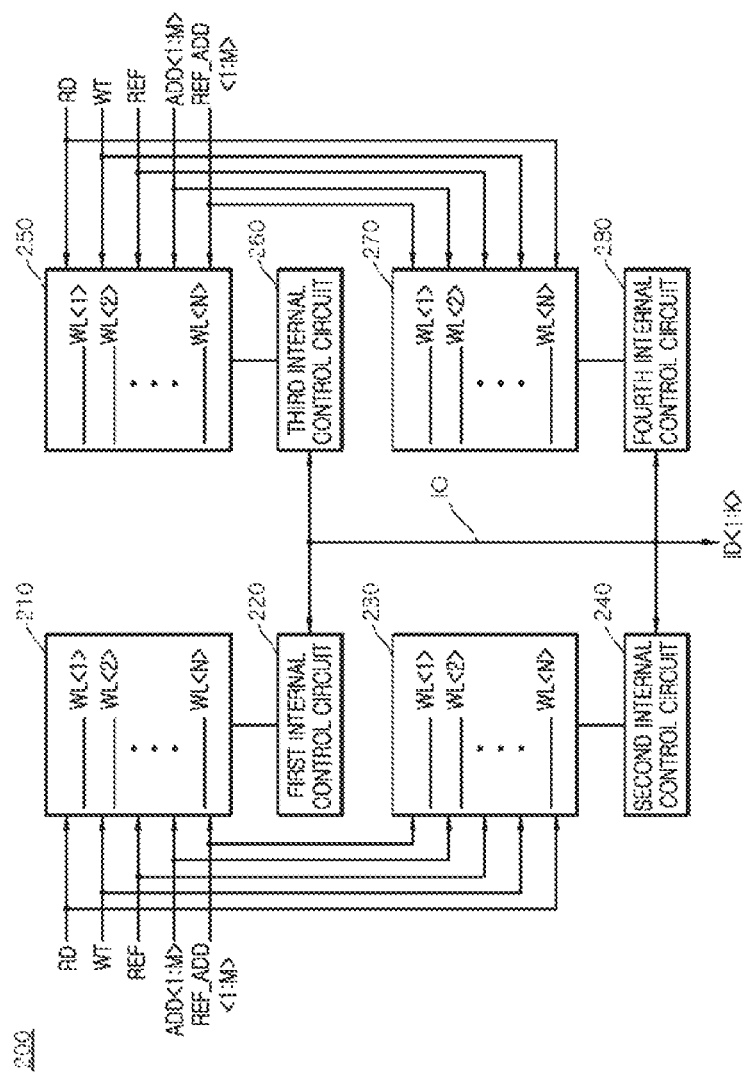
FIG. 3 is a block diagram illustrating a configuration of a core circuit included in the semiconductor device illustrated in FIG. 2.

FIG. 3 is a block diagram illustrating a configuration of the core circuit 200. As illustrated in FIG. 3, the core circuit 200 may include a first memory region 210, a first internal control circuit 220, a second memory region 230, a second internal control circuit 240, a third memory region 250, a third internal control circuit 260, a fourth memory region 270, and a fourth internal control circuit 280.

The first memory region 210 may include first to $N^{th}$ word lines WL<1:N>. When the read signal RD is inputted to the first memory region 210, the first memory region 210 may output the first to $K^{th}$ internal data ID<1:K> stored in memory cells connected to a word line, which is activated by the first to $M^{th}$ address signals ADD<1:M>, among the first to $N^{th}$ word lines WL<1:N>. When the write signal WT is inputted to the first memory region 210, the first memory region 210 may store the first to $K^{th}$ internal data ID<1:K> into memory cells connected to a word line, which is activated by the first to $M^{th}$ address signals ADD<1:M>, among the first to $N^{th}$ word lines WL<1:N>. When the refresh signal REF is inputted to the first memory region 210, the first memory region 210 may activate one or more word lines among the first to $N^{th}$ word lines WL<1:N> based on the first to $M^{th}$ refresh address signals REF_ADD<1:M>.

The first internal control circuit 220 may be electrically connected to the first memory region 210. The first internal control circuit 220 may output the first to $K^{th}$ internal data ID<1:K> read out of the first memory region 210 through the input/output line IO during the read operation. The first internal control circuit 220 may output the first to $K^{th}$ internal data ID<1:K> loaded on the input/output line IO to the first memory region 210 during the write operation. The first internal control circuit 220 may be realized using a general differential amplification circuit that senses and amplifies the first to $K^{th}$ internal data ID<1:K>.

The second memory region 230 may also include first to $N^{th}$ word lines WL<1:N>. When the read signal RD is inputted to second memory region 230, the second memory region 230 may output the first to $K^{th}$ internal data ID<1:K> stored in memory cells connected to a word line, which is activated by the first to $M^{th}$ address signals ADD<1:M>, among the first to $N^{th}$ word lines WL<1:N>. When the write signal WT is inputted to the second memory region 230, the second memory region 230 may store the first to $K^{th}$ internal data ID<1:K> into memory cells connected to a word line, which is activated by the first to $M^{th}$ address signals ADD<1:M>, among the first to $N^{th}$ word lines WL<1:N>. When the refresh signal REF is inputted to the second memory region 230, the second memory region 230 may activate any one or more word lines among the first to $N^{th}$ word lines WL<1:N> based on the first to $M^{th}$ refresh address signals REF_ADD<1:M>.

The second internal control circuit 240 may be electrically connected to the second memory region 230. The second internal control circuit 240 may output the first to $K^{th}$ internal data ID<1:K> read out of the second memory region 230 through the input/output line IO during the read operation. The second internal control circuit 240 may output the first to $K^{th}$ internal data ID<1:K> loaded on the input/output line IO to the second memory region 230 during the write operation. The second internal control circuit 240 may be realized using a general differential amplification circuit that senses and amplifies the first to $K^{th}$ internal data ID<1:K>.

The third memory region 250 may also include first to $N^{th}$ word lines WL<1:N>. When the read signal RD is inputted to the third memory region 250, the third memory region 250 may output the first to $K^{th}$ internal data ID<1:K> stored in memory cells connected to a word line, which is activated by the first to $M^{th}$ address signals ADD<1:M>, among the first to $N^{th}$ word lines WL<1:N>. When the write signal WT is inputted to the third memory region 250, the third memory region 250 may store the first to $K^{th}$ internal data ID<1:K> into memory cells connected to a word line, which is activated by the first to $M^{th}$ address signals ADD<1:M>, among the first to $N^{th}$ word lines WL<1:N>. When the refresh signal REF is inputted to the third memory region 250, the third memory region 250 may activate any one or more word lines among the first to $N^{th}$ word lines WL<1:N> based on the first to $M^{th}$ refresh address signals REF_ADD<1:M>.

The third internal control circuit 260 may be electrically connected to the third memory region 250. The third internal control circuit 260 may output the first to $K^{th}$ internal data ID<1:K> read out of the third memory region 250 through the input/output line IO during the read operation. The third internal control circuit 260 may output the first to $K^{th}$ internal data ID<1:K> loaded on the input/output line IO to the third memory region 250 during the write operation. The third internal control circuit 260 may be realized using a general differential amplification circuit that senses and amplifies the first to $K^{th}$ internal data ID<1:K>.

The fourth memory region 270 may also include first to $N^{th}$ word lines WL<1:N>. When the read signal RD is inputted to the fourth memory region 270, the fourth memory region 270 may output the first to $K^{th}$ internal data ID<1:K> stored in memory cells connected to a word line, which is activated by the first to $M^{th}$ address signals ADD<1:M>, among the first to $N^{th}$ word lines WL<1:N>. When the write signal WT is inputted to the fourth memory region 270, the fourth memory region 270 may store the first to $K^{th}$ internal data ID<1:K> into memory cells connected to a word line, which is activated by the first to $M^{th}$ address signals ADD<1:M>, among the first to $N^{th}$ word lines WL<1:N>. When the refresh signal REF is inputted to the fourth memory region 270, the fourth memory region 270 may activate any one or more word lines among the first to $N^{th}$ word lines WL<1:N> based on the first to $M^{th}$ refresh address signals REF_ADD<1:M>.

The fourth internal control circuit 280 may be electrically connected to the fourth memory region 270. The fourth internal control circuit 280 may output the first to $K^{th}$ internal data ID<1:K> read out of the fourth memory region 270 through the input/output line IO during the read operation. The fourth internal control circuit 280 may output the first to $K^{th}$ internal data ID<1:K> loaded on the input/output line IO to the fourth memory region 270 during the write operation. The fourth internal control circuit 280 may be realized using a general differential amplification circuit that senses and amplifies the first to $K^{th}$ internal data ID<1:K>.

Figure 4:
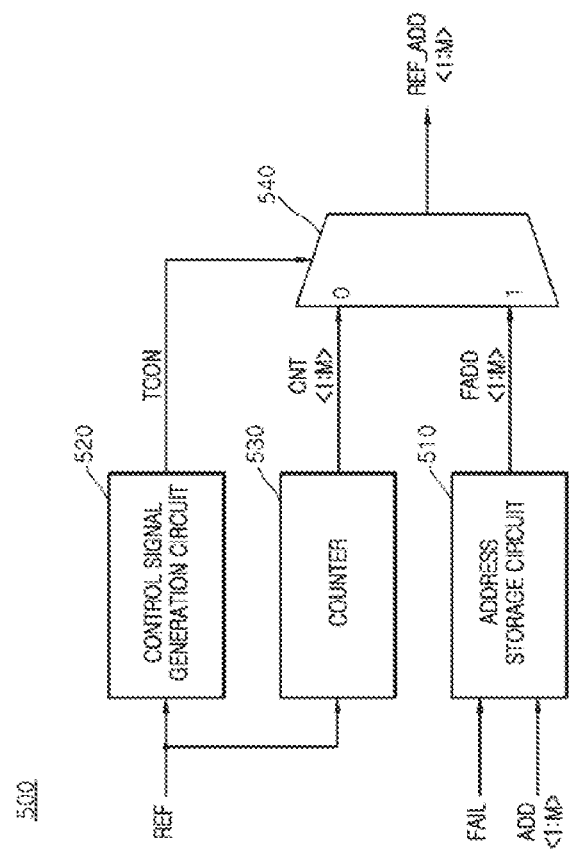
FIG. 4 is a block diagram illustrating a configuration of a refresh control circuit included in the semiconductor device illustrated in FIG. 2.

FIG. 4 is a block diagram illustrating a configuration of the refresh control circuit 500. As illustrated in FIG. 4, the refresh control circuit 500 may include an address storage circuit 510, a control signal generation circuit 520, a counter 530, and a selection transmission circuit 540.

The address storage circuit 510 may store the first to $M^{th}$ address signals ADD<1:M> based on the failure detection signal FAIL. The address storage circuit 510 may store the first to $M^{th}$ address signals ADD<1:M> inputted at a point in time when the failure detection signal FAIL is enabled. The address storage circuit 510 may output the first to $M^{th}$ address signals ADD<1:M> stored at the point in time when the failure detection signal FAIL is enabled, as first to $M^{th}$ failure address signals FADD<1:M>.

The control signal generation circuit 520 may generate a control signal TCON based on the refresh signal REF. The control signal generation circuit 520 may generate the control signal TCON that is enabled when the refresh signal REF is inputted by the first predetermined number of times. The control signal generation circuit 520 may generate the control signal TCON that is enabled to have a logic "high" level when the refresh signal REF is successively inputted twice or more.

The counter 530 may generate first to $M^{th}$ counting signals CNT<1:M> based on the refresh signal REF. The counter 530 may generate the first to $M^{th}$ counting signals CNT<1:M> sequentially counted when the refresh signal REF is inputted to the counter 530.

The selection transmission circuit 540 may generate the first to $M^{th}$ refresh address signals REF_ADD<1:M> from either the first to $M^{th}$ failure address signals FADD<1:M> or the first to $M^{th}$ counting signals CNT<1:M> based on the control signal TCON. When the control signal TCON is disabled to have a logic "low" level, the selection transmission circuit 540 may output the first to $M^{th}$ counting signals CNT<1:M> as the first to $M^{th}$ refresh address signals REF_ADD<1:M>. When the control signal TCON is enabled to a logic "high" level, the selection transmission circuit 540 may output the first to $M^{th}$ failure address signals FADD<1:M> as the first to $M^{th}$ refresh address signals REF_ADD<1:M>.

An error correction method of the semiconductor system according to an embodiment of the present disclosure will be described hereinafter with reference to FIG. 5.

Figure 5:
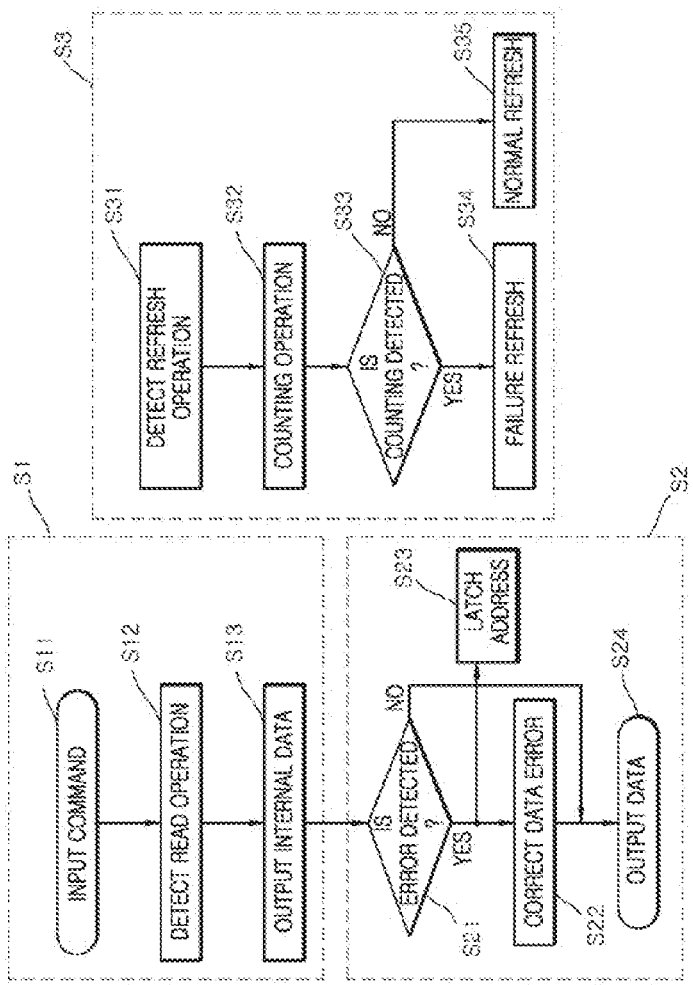
FIG. 5 is a flowchart illustrating an error correction method of the semiconductor system according to an embodiment of the present disclosure.

Referring to FIG. 5, the error correction method may include a read operation step S1, an error correction step S2, and a refresh step S3.

The read operation step S1 may include a command input step S11, a read operation detection step S12, and an internal data output step S13.

The command input step S11 may correspond to a step of transmitting the clock signal CLK, the command signal CMD, and the first to $M^{th}$ address signals ADD<1:M> for performing the read operation from the controller 10 to the semiconductor device 20.

The read operation detection step S12 may correspond to a step of generating the read signal RD based on the clock signal CLK and the command signal CMD outputted from the controller 10.

The internal data output step S13 may correspond to a step of outputting the first to $K^{th}$ internal data ID<1:K> stored in the core circuit 200 to the input/output line IO based on the read signal RD and the first to $M^{th}$ address signals ADD<1:M>.

The error correction step S2 may include an error detection step S21, a data error correction step S22, an address latching step S23, and a data output step S24.

The error detection step S21 may correspond to a step of detecting an error of the first to $K^{th}$ internal data ID<1:K> loaded on the input/output line IO by using the error correction circuit 400. When an error is detected from the first to $K^{th}$ internal data ID<1:K> at the error detection step S21 (YES), the error correction circuit 400 may generate the failure detection signal FAIL. The refresh control circuit 500 may store the first to $M^{th}$ address signals ADD<1:M> based on the failure detection signal FAIL. When no error is detected from the first to $K^{th}$ internal data ID<1:K> at the error detection step S21 (NO), the data output step S24 may be performed.

The data error correction step S22 may correspond to a step of correcting an error of the failed first to $K^{th}$ internal data ID<1:K> using an error correction code (ECC) in the error correction circuit 400.

The address latching step S23 may correspond to a step of storing the first to $M^{th}$ address signals ADD<1:M> as first to $M^{th}$ failure address signals FADD<1:M> in the refresh control circuit 500 when the failure detection signal FAIL is enabled.

The data output step S24 may correspond to a step of generating the first to $K^{th}$ data DATA<1:K> by buffering the first to $K^{th}$ internal data ID<1:K>, which is corrected at the data error correction step S22, in the data input/output circuit 300. The data output step S24 may also correspond to a step of outputting the first to $K^{th}$ data DATA<1:K> generated by the data input/output circuit 300 to the controller 10.

The refresh step S3 may include a refresh operation detection step S31, a counting operation step S32, a counting detection step S33, a failure refresh step S34, and a normal refresh step S35.

The refresh operation detection step S31 may correspond to a step of generating the refresh signal REF based on the clock signal CLK and the command signal CMD outputted from the controller 10.

The counting operation step S32 may correspond to a step of detecting the refresh signal REF whenever the refresh signal REF is inputted to the refresh control circuit 500.

The counting detection step S33 may correspond to a step of detecting whether the refresh signal REF is inputted to the refresh control circuit 500 by the first predetermined number of times.

When the refresh signal REF is inputted to the refresh control circuit 500 by the first predetermined number of times at the counting detection step S33 (YES), the failure refresh step S34 may be performed.

When the refresh signal REF is inputted to the refresh control circuit 500 by the number of times less than the first predetermined number of times at the counting detection step S33 (NO), the normal refresh step S35 may be performed.

The failure refresh step S34 may correspond to a step of generating the first to $M^{th}$ refresh address signals REF_ADD<1:M> for activating a word line, which is connected to memory cells storing the first to $K^{th}$ internal data ID<1:K> including an error, from the first to $M^{th}$ address signals ADD<1:M> in the refresh control circuit 500. The failure refresh step S34 may correspond to a step of performing the refresh operation by additionally activating the word line connected to memory cells storing the first to $K^{th}$ internal data ID<1:K> including an error based on the first to $M^{th}$ refresh address signals REF_ADD<1:M> in the core circuit 200.

The normal refresh step S35 may correspond to a step of generating the first to $M^{th}$ refresh address signals REF_ADD<1:M> in the refresh control circuit 500 to sequentially activate the multiple word lines in the core circuit 200. The normal refresh step S35 may correspond to a step of performing the refresh operation by sequentially activating the multiple word lines in the core circuit 200 based on the refresh signal REF and the first to $M^{th}$ refresh address signals REF_ADD<1:M> sequentially counted.

The semiconductor system 1 having the afore mentioned configuration may exhibit the reliability of internal data by additionally refreshing memory cells storing failed internal data when the refresh signal is repeatedly inputted by the first predetermined number of times during the refresh operation.

Figure 6:
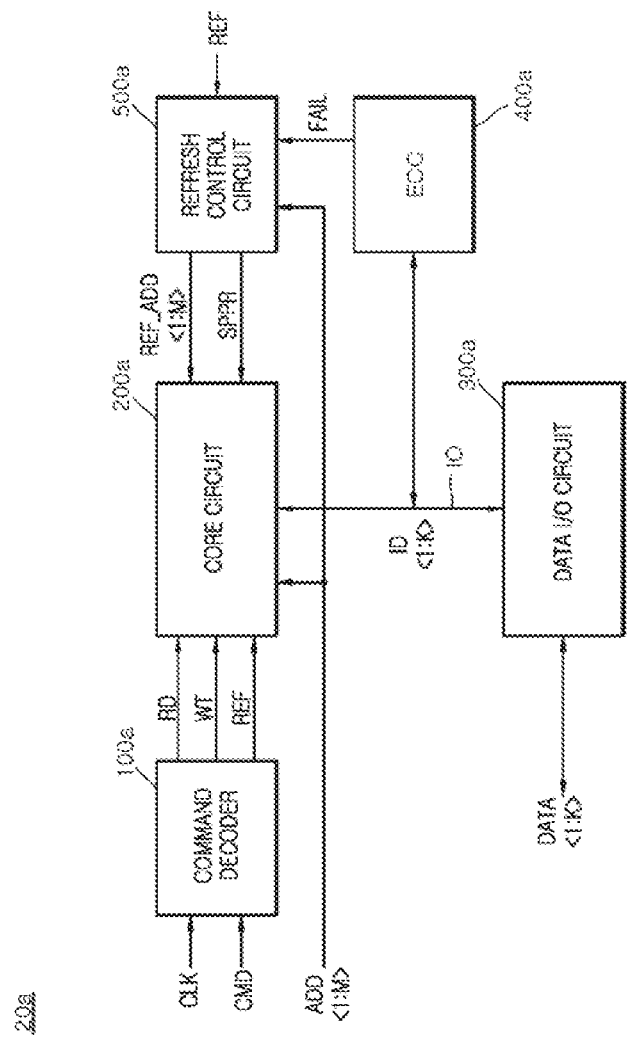
FIG. 6 is a block diagram illustrating a configuration of a semiconductor device according to another embodiment of the present disclosure.

FIG. 6 is a block diagram illustrating a configuration of a semiconductor device 20a corresponding to another example of the semiconductor device 20 illustrated in FIG. 2. As illustrated in FIG. 6, the semiconductor device 20a may include a command decoder 100a, a core circuit 200a, a data input/output circuit 300a, an error correction circuit 400a, and a refresh control circuit 500a.

The command decoder 100a may be synchronized with a clock signal CLK to generate a read signal RD, a write signal WT, and a refresh signal REF, one of which is selectively enabled, from a command signal CMD. The command decoder 100a may decode the command signal CMD in synchronization with the clock signal CLK to generate the read signal RD for performing a read operation. The command decoder 100a may decode the command signal CMD in synchronization with the clock signal CLK to generate the write signal WT for performing a write operation. The command decoder 100a may decode the command signal CMD in synchronization with the clock signal CLK to generate the refresh signal REF for performing a refresh operation.

The core circuit 200a may output first to $K^{th}$ internal data ID<1:K> stored therein based on the read signal RD and the first to $M^{th}$ address signals ADD<1:M> during the read operation. The core circuit 200a may store the first to $K^{th}$ internal data ID<1:K> based on the write signal WT and the first to $M^{th}$ address signals ADD<1:M> during the write operation. The core circuit 200 may activate multiple word lines based on the refresh signal REF and the first to $M^{th}$ refresh address signals REF_ADD<1:M> during the refresh operation. The core circuit 200a may perform a repair operation for replacing a word line connected memory cells storing the failed first to $K^{th}$ internal data ID<1:K> including erroneous data with a repair line, based on a repair signal SPPR during the refresh operation. The first to $K^{th}$ internal data ID<1:K> stored in the core circuit 200a may be outputted through an input/output line IO during the read operation. The first to $K^{th}$ internal data ID<1:K> may be inputted to the core circuit 200a through the input/output line IO during the write operation.

The data input/output circuit 300a may buffer the first to $K^{th}$ internal data ID<1:K> loaded on the input/output line IO to generate first to $K^{th}$ data DATA<1:K> during the read operation. The data input/output circuit 300a may output the first to $K^{th}$ data DATA<1:K> to the controller 10 during the read operation. The data input/output circuit 300a may buffer the first to $K^{th}$ data DATA<1:K> to generate the first to $K^{th}$ internal data ID<1:K> during the write operation. The data input/output circuit 300a may output the first to $K^{th}$ internal data ID<1:K> to the input/output line IO during the write operation. Although FIG. 6 illustrates the input/output line IO with a single line, the input/output line IO may be configured to include multiple lines.

The error correction circuit 400a may detect an error of the first to $K^{th}$ internal data ID<1:K> loaded on the input/output line IO during the read operation. The error correction circuit 400a may correct the error of the first to $K^{th}$ internal data ID<1:K> during the read operation and may output the corrected data of the first to $K^{th}$ internal data ID<1:K> to the input/output line IO. The error correction circuit 400a may generate a failure detection signal FAIL that is enabled when an error exists in the first to $K^{th}$ internal data ID<1:K> loaded on the input/output line IO during the read operation. The error correction circuit 400a may detect an error of the first to $K^{th}$ internal data ID<1:K> loaded on the input/output line IO during the write operation. The error correction circuit 400a may correct the error of the first to $K^{th}$ internal data ID<1:K> during the write operation and may output the corrected data of the first to $K^{th}$ internal data ID<1:K> to the input/output line IO. The error correction circuit 400a may generate the failure detection signal FAIL that is enabled when an error exists in the first to $K^{th}$ internal data ID<1:K> loaded on the input/output line IO during the write operation. The error correction circuit 400a may be realized using a general ECC circuit that corrects an error using an error correction code (ECC).

The refresh control circuit 500a may store the first to $M^{th}$ address signals ADD<1:M> for selecting the first to $K^{th}$ internal data ID<1:K> in response to the failure detection signal FAIL during the read operation. The refresh control circuit 500a may store the first to $M^{th}$ address signals ADD<1:M> for selecting the first to $K^{th}$ internal data ID<1:K> in response to the failure detection signal FAIL during the write operation. The refresh control circuit 500a may generate the first to $M^{th}$ refresh address signals REF_ADD<1:M> for activating a word line connected to memory cells storing the failed first to $K^{th}$ internal data ID<1:K> including erroneous data from the first to $M^{th}$ address signals ADD<1:M>, when the refresh signal REF is inputted to the refresh control circuit 500a by a first predetermined number of times during the refresh operation. The refresh control circuit 500a may regenerate the first to $M^{th}$ refresh address signals REF_ADD<1:M> for activating the word line connected to the memory cells storing the first to $K^{th}$ internal data ID<1:K> including the erroneous data, when the first to $M^{th}$ address signals ADD<1:M> for selecting the word line connected to the memory cells storing the first to $K^{th}$ internal data ID<1:K> including the erroneous data are inputted to the refresh control circuit 500a by a second predetermined number of times during the refresh operation. The refresh control circuit 500a may generate the repair signal SPPR that is enabled when the first to $K^{th}$ internal data ID<1:K> including the erroneous data are inputted to the refresh control circuit 500a by a third predetermined number of times. A case that the refresh signal REF is inputted by the first predetermined number of times may be set as a case that the refresh signal REF is inputted twice or more. The first predetermined number of times may correspond to the number of times that the refresh signal REF is successively inputted. A case that the first to $M^{th}$ address signals ADD<1:M> are inputted by the second predetermined number of times may be set as a case that the first to $M^{th}$ address signals ADD<1:M> having a logic level combination for selecting the first to $K^{th}$ internal data ID<1:K> including erroneous data are inputted twice. The second predetermined number of times may correspond to the number of times that the first to $M^{th}$ address signals ADD<1:M> having the same logic level combination are successively inputted. A case that the first to $K^{th}$ internal data ID<1:K> including erroneous data are inputted by the third predetermined number of times may be set as a case that the first to $M^{th}$ address signals ADD<1:M> having a logic level combination for selecting the first to $K^{th}$ internal data ID<1:K> having erroneous data are inputted at last three times.

The semiconductor device 20a having the aforementioned configuration may generate the first to $K^{th}$ data DATA<1:K> from the first to $K^{th}$ internal data ID<1:K> stored therein in synchronization with the clock signal CLK during the read operation and may output the first to $K^{th}$ data DATA<1:K> to the controller 10. The semiconductor device 20a may receive the first to $K^{th}$ data DATA<1:K> from the controller 10 in synchronization with the clock signal CLK to generate the first to $K^{th}$ internal data ID<1:K> from the first to $K^{th}$ data DATA<1:K> and to store the first to $K^{th}$ internal data ID<1:K> therein during the write operation. The semiconductor device 20a may sequentially activate multiple word lines in the core circuit 200a based on the first to $M^{th}$ refresh address signals REF_ADD<1:M> during the refresh operation. The semiconductor device 20a may reactivate a word line connected to memory cells storing the first to $K^{th}$ internal data ID<1:K> including erroneous data when the refresh signal REF is generated by the first predetermined number of times during the refresh operation. The semiconductor device 20a may reactivate a word line connected to memory cells storing the first to $K^{th}$ internal data ID<1:K> including erroneous data when the first to $M^{th}$ address signals ADD<1:M> having a logic level combination for selecting the first to $K^{th}$ internal data ID<1:K> including the erroneous data are inputted twice during the refresh operation. When the first to $M^{th}$ address signals ADD<1:M> having a logic level combination for selecting the first to $K^{th}$ internal data ID<1:K> including erroneous data are inputted three times or more during the refresh operation, the semiconductor device 20a may replace a word line connected to memory cells storing the first to $K^{th}$ internal data ID<1:K> including erroneous data with a repair line.

Figure 7:
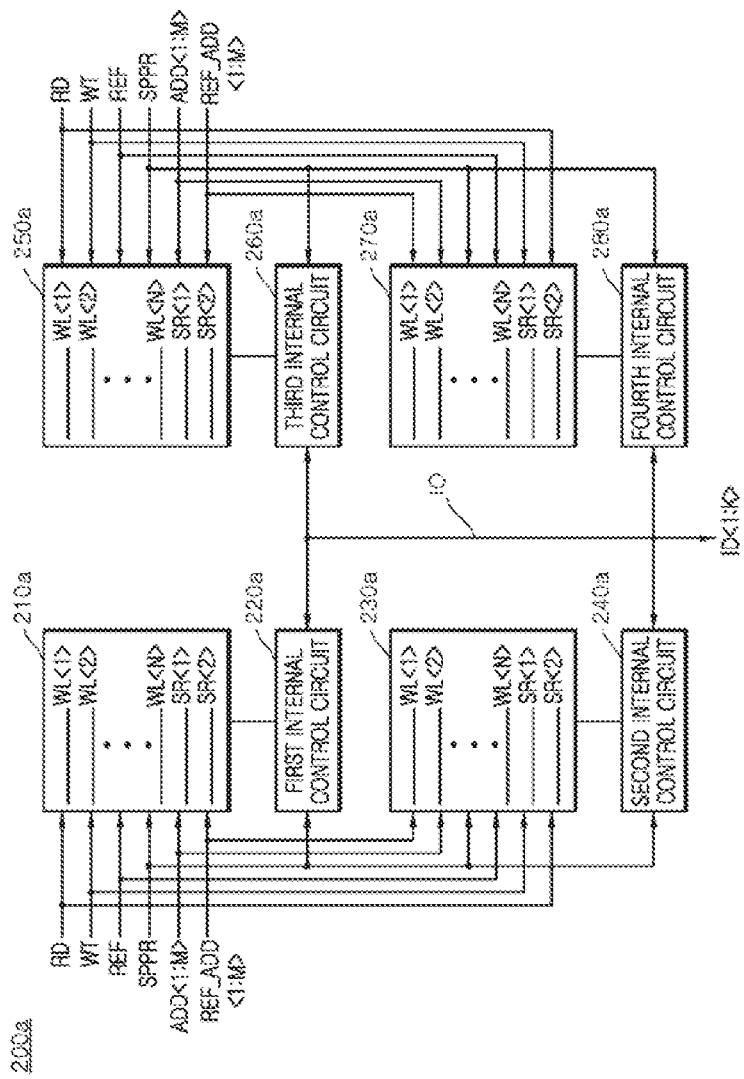
FIG. 7 is a block diagram illustrating a configuration of a core circuit included in the semiconductor device illustrated in FIG. 6.

FIG. 7 is a block diagram illustrating a configuration of the core circuit 200a. As illustrated in FIG. 7, the core circuit 200a may include a first memory region 210a, a first internal control circuit 220a, a second memory region 230a, a second internal control circuit 240a, a third memory region 250a, a third internal control circuit 260a, a fourth memory region 270a, and a fourth internal control circuit 280a.

The first memory region 210a may include first to $N^{th}$ word lines WL<1:N> and first and second repair lines SR<1:2>. When the read signal RD is inputted to the first memory region 210a, the first memory region 210a may output the first to $K^{th}$ internal data ID<1:K> stored in memory cells connected to a word line, which is activated by the first to $M^{th}$ address signals ADD<1:M>, among the first to $N^{th}$ word lines WL<1:N>. When the write signal WT is inputted to the first memory region 210a, the first memory region 210a may store the first to $K^{th}$ internal data ID<1:K> into memory cells connected to a word line, which is activated by the first to $M^{th}$ address signals ADD<1:M>, among the first to $N^{th}$ word lines WL<1:N>. When the refresh signal REF is inputted to the first memory region 210a, the first memory region 210a may activate any one or more word lines among the first to $N^{th}$ word lines WL<1:N> based on the first to $M^{th}$ refresh address signals REF_ADD<1:M>. When the repair signal SPPR is inputted to the first memory region 210a, the first memory region 210a may replace a failed word line, which is selected by the first to $M^{th}$ refresh address signals REF_ADD<1:M>, among the first to $N^{th}$ word lines WL<1:N>, with any one of the first and second repair lines SR<1:2>.

The first internal control circuit 220a may be electrically connected to the first memory region 210a. The first internal control circuit 220a may output the first to $K^{th}$ internal data ID<1:K> read out of the first memory region 210a through the input/output line IO during the read operation. The first internal control circuit 220a may output the first to $K^{th}$ internal data ID<1:K> loaded on the input/output line IO to the first memory region 210a during the write operation. The first internal control circuit 220a may be realized using a general differential amplification circuit that senses and amplifies the first to $K^{th}$ internal data ID<1:K>. When the repair signal SPPR is inputted to the first internal control circuit 220a, the first internal control circuit 220a may control the first memory region 210a to replace a failed word line, which is selected by the first to $M^{th}$ refresh address signals REF_ADD<1:M>, among the first to $N^{th}$ word lines WL<1:N> with any one of the first and second repair lines SR<1:2>. When the repair signal SPPR is inputted to the first internal control circuit 220a, the first internal control circuit 220a may copy the first to $K^{th}$ internal data ID<1:K> and may control the first memory region 210a to store the copied first to $K^{th}$ internal data ID<1:K> into the first and second repair lines SR<1:2>.

The second memory region 230a may also include first to $N^{th}$ word lines WL<1:N> and first and second repair lines SR<1:2>. When the read signal RD is inputted to the second memory region 230a, the second memory region 230a may output the first to $K^{th}$ internal data ID<1:K> stored in memory cells connected to a word line, which is activated by the first to $M^{th}$ address signals ADD<1:M>, among the first to $N^{th}$ word lines WL<1:N>. When the write signal WT is inputted to the second memory region 230a, the second memory region 230a may store the first to $K^{th}$ Internal data ID<1:K> into memory cells connected to a word line, which is activated by the first to $M^{th}$ address signals ADD<1:M>, among the first to $N^{th}$ word lines WL<1:N>. When the refresh signal REF is inputted to the second memory region 230a, the second memory region 230a may activate one or more word lines among the first to $N^{th}$ word lines WL<1:N> based on the first to $M^{th}$ refresh address signals REF_ADD<1:M>. When the repair signal SPPR is inputted to the second memory region 230a, the second memory region 230a may replace a failed word line, which is selected by the first to $M^{th}$ refresh address signals REF_ADD<1:M>, among the first to $N^{th}$ word lines WL<1:N> with any one of the first and second repair lines SR<1:2>.

The second internal control circuit 240a may be electrically connected to the second memory region 230a. The second internal control circuit 240a may output the first to $K^{th}$ internal data ID<1:K> read out of the second memory region 230a through the input/output line IO during the read operation. The second internal control circuit 240a may output the first to $K^{th}$ internal data ID<1:K> loaded on the input/output line IO to the second memory region 230a during the write operation. The second internal control circuit 240a may be realized using a general differential amplification circuit that senses and amplifies the first to $K^{th}$ internal data ID<1:K>. When the repair signal SPPR is inputted to the second internal control circuit 240a, the second internal control circuit 240a may control the second memory region 230a to replace a failed word line, which is selected by the first to $M^{th}$ refresh address signals REF_ADD<1:M>, among the first to $N^{th}$ word lines WL<1:N> with any one of the first and second repair lines SR<1:2>. When the repair signal SPPR is inputted to the second internal control circuit 240a, the second internal control circuit 240a may copy the first to $K^{th}$ internal data ID<1:K> and may control the second memory region 230a to store the copied first to $K^{th}$ internal data ID<1:K>) into the first and second repair lines SR<1:2>.

The third memory region 250a may also include first to $N^{th}$ word lines WL<1:N> and first and second repair lines SR<1:2>. When the read signal RD is inputted to the third memory region 250a, the third memory region 250a may output the first to $K^{th}$ internal data ID<1:K> stored in memory cells connected to a word line, which is activated by the first to $M^{th}$ address signals ADD<1:M>, among the first to $N^{th}$ word lines WL<1:N>. When the write signal WT is inputted to the third memory region 250a, the third memory region 250a may store the first to $K^{th}$ internal data ID<1:K> into memory cells connected to a word line, which is activated by the first to $M^{th}$ address signals ADD<1:M>, among the first to $N^{th}$ word lines WL<1:N>. When the refresh signal REF is inputted to the third memory region 250a, the third memory region 250a may activate one or more word lines among the first to $N^{th}$ word lines WL<1:N> based on the first to $M^{th}$ refresh address signals REF_ADD<1:M>. When the repair signal SPPR is inputted to the third memory region 250a, the third memory region 250a may replace a failed word line, which is selected by the first to $M^{th}$ refresh address signals REF_ADD<1:M>, among the first to $N^{th}$ word lines WL<1:N> with any one of the first and second repair lines SR<1:2>.

The third internal control circuit 260a may be electrically connected to the third memory region 250a. The third Internal control circuit 260a may output the first to $K^{th}$ internal data ID<1:K> read out of the third memory region 250a through the input/output line IO during the read operation. The third internal control circuit 260a may output the first to $K^{th}$ internal data ID<1:K> loaded on the input/output line IO to the third memory region 250a during the write operation. The third internal control circuit 260a may be realized using a general differential amplification circuit that senses and amplifies the first to $K^{th}$ internal data ID<1:K>. When the repair signal SPPR is inputted to the third internal control circuit 260a, the third internal control circuit 260a may control the third memory region 250a to replace a failed word line, which is selected by the first to $M^{th}$ refresh address signals REF_ADD<1:M>, among the first to $N^{th}$ word lines WL<1:N> with any one of the first and second repair lines SR<1:2>. When the repair signal SPPR is inputted to the third internal control circuit 260a, the third internal control circuit 260a may copy the first to $K^{th}$ internal data ID<1:K> and may control the third memory region 250a to store the copied first to $K^{th}$ internal data ID<1:K>) into the first and second repair lines SR<1:2>.

The fourth memory region 270a may also include first to $N^{th}$ word lines WL<1:N> and first and second repair lines SR<1:2>. When the read signal RD is inputted to the fourth memory region 270a, the fourth memory region 270a may output the first to $K^{th}$ internal data ID<1:K> stored in memory cells connected to a word line, which is activated by the first to $M^{th}$ address signals ADD<1:M> among the first to $N^{th}$ word lines WL<1:N>. When the write signal WT is inputted to the fourth memory region 270a, the fourth memory region 270a may store the first to $K^{th}$ internal data ID<1:K> into memory cells connected to a word line, which is activated by the first to $M^{th}$ address signals ADD<1:M>, among the first to $N^{th}$ word lines WL<1:N>. When the refresh signal REF is inputted to the fourth memory region 270a, the fourth memory region 270a may activate one or more word lines among the first to $N^{th}$ word lines WL<1:N> based on the first to $M^{th}$ refresh address signals REF_ADD<1:M>. When the repair signal SPPR is inputted to the fourth memory region 270a, the fourth memory region 270a may replace a failed word line, which is selected by the first to $M^{th}$ refresh address signals REF_ADD<1:M>, among the first to $N^{th}$ word lines WL<1:N> with any one of the first and second repair lines SR<1:2>.

The fourth internal control circuit 280a may be electrically connected to the fourth memory region 270a. The fourth internal control circuit 280a may output the first to $K^{th}$ internal data ID<1:K> read out of the fourth memory region 270a through the input/output line IO during the read operation. The fourth internal control circuit 280a may output the first to $K^{th}$ internal data ID<1:K> loaded on the input/output line IO to the fourth memory region 270a during the write operation. The fourth internal control circuit 280a may be realized using a general differential amplification circuit that senses and amplifies the first to $K^{th}$ internal data ID<1:K>. When the repair signal SPPR is inputted to the fourth internal control circuit 280a, the fourth internal control circuit 280a may control the fourth memory region 270a to replace a failed word line, which is selected by the first to $M^{th}$ refresh address signals REF_ADD<1:M>, among the first to $N^{th}$ word lines WL<1:N> with any one of the first and second repair lines SR<1:2>. When the repair signal SPPR is inputted to the fourth internal control circuit 280a, the fourth internal control circuit 280a may copy the first to $K^{th}$ internal data ID<1:K> and may control the fourth memory region 270a to store the copied first to $K^{th}$ internal data ID<1:K> into the first and second repair lines SR<1:2>.

Figure 8:
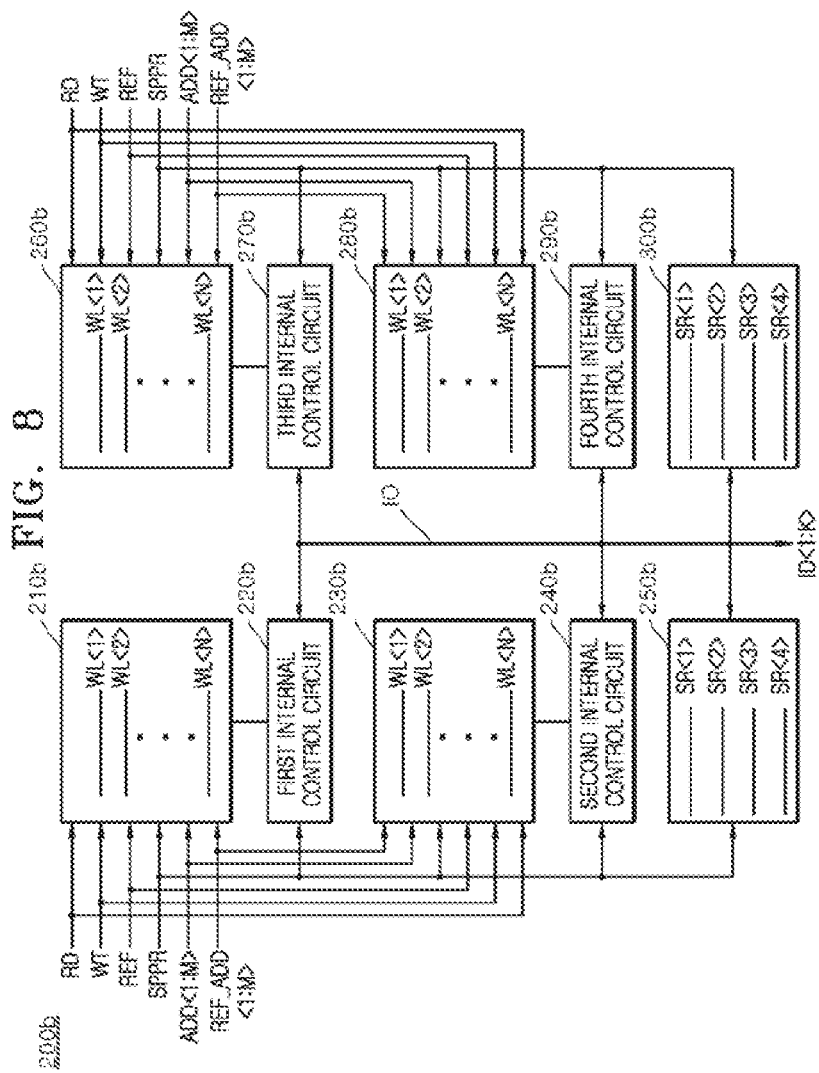
FIG. 8 is a block diagram illustrating another example of the core circuit included in the semiconductor device illustrated in FIG. 6.

FIG. 8 is a block diagram illustrating a configuration of a core circuit 200b corresponding to another example of the core circuit 200a illustrated in FIG. 7. As illustrated in FIG. 8, the core circuit 200b may include a first memory region 210b, a first internal control circuit 220b, a second memory region 230b, a second internal control circuit 240b, a first repair region 250b, a third memory region 260b, a third internal control circuit 270b, a fourth memory region 280b, a fourth internal control circuit 290b, and a second repair region 300b.

The first memory region 210b may include first to $N^{th}$ word lines WL<1:N>. When the read signal RD is inputted to the first memory region 210b, the first memory region 210b may output the first to $K^{th}$ internal data ID<1:K> stored in memory cells connected to a word line, which is activated by the first to $M^{th}$ address signals ADD<1:M>, among the first to $N^{th}$ word lines WL<1:N>. When the write signal WT is inputted to the first memory region 210b, the first memory region 210b may store the first to $K^{th}$ internal data ID<1:K> into memory cells connected to a word line, which is activated by the first to $M^{th}$ address signals ADD<1:M>, among the first to $N^{th}$ word lines WL<1:N>. When the refresh signal REF is inputted to the first memory region 210b, the first memory region 210b may activate one or more word lines among the first to $N^{th}$ word lines WL<1:N> based on the first to $M^{th}$ refresh address signals REF_ADD<1:M>. When the repair signal SPPR is inputted to the first memory region 210b, the first memory region 210b may replace a failed word line, which is selected by the first to $M^{th}$ refresh address signals REF_ADD<1:M>, among the first to $N^{th}$ word lines WL<1:N> with any one of first and second repair lines SR<1:2> included in the first repair region 250b.

The first internal control circuit 220b may be electrically connected to the first memory region 210b and the first repair region 250b. The first internal control circuit 220b may output the first to $K^{th}$ internal data ID<1:K> read out of the first memory region 210b through the input/output line IO during the read operation. The first internal control circuit 220b may output the first to $K^{th}$ internal data ID<1:K> loaded on the input/output line IO to the first memory region 210b during the write operation. The first internal control circuit 220b may be realized using a general differential amplification circuit that senses and amplifies the first to $K^{th}$ internal data ID<1:K>. When the repair signal SPPR is inputted to the first internal control circuit 220b, the first internal control circuit 220b may control the first memory region 210b and the first repair region 250b to replace a failed word line, which is selected by the first to $M^{th}$ refresh address signals REF_ADD<1:M>, among the first to $N^{th}$ word lines WL<1:N> with any one of the first and second repair lines SR<1:2> included in the first repair region 250b. When the repair signal SPPR is inputted to the first internal control circuit 220b, the first internal control circuit 220b may copy the first to $K^{th}$ internal data ID<1:K> and may control the first memory region 210b and the first repair region 250b to store the copied first to $K^{th}$ internal data ID<1:K>) into the first and second repair lines SR<1:2>.

The second memory region 230b may also include first to $N^{th}$ word lines WL<1:N>. When the read signal RD is inputted to the second memory region 230b, the second memory region 230b may output the first to $K^{th}$ internal data ID<1:K> stored in memory cells connected to a word line, which is activated by the first to $M^{th}$ address signals ADD<1:M>, among the first to $N^{th}$ word lines WL<1:N>. When the write signal WT is inputted to the second memory region 230b, the second memory region 230b may store the first to $K^{th}$ internal data ID<1:K> into memory cells connected to a word line, which is activated by the first to $M^{th}$ address signals ADD<1:M>, among the first to $N^{th}$ word lines WL<1:N>. When the refresh signal REF is inputted to the second memory region 230b, the second memory region 230b may activate one or more word lines among the first to $N^{th}$ word lines WL<1:N> based on the first to $M^{th}$ refresh address signals REF_ADD<1:M>. When the repair signal SPPR is inputted to the second memory region 230b, the second memory region 230b may replace a failed word line, which is selected by the first to $M^{th}$ refresh address signals REF_ADD<1:M>, among the first to $N^{th}$ word lines WL<1:N> with any one of third and fourth repair lines SR<3:4> included in the first repair region 250b.

The second internal control circuit 240b may be electrically connected to the second memory region 230b and the first repair region 250b. The second internal control circuit 240b may output the first to $K^{th}$ internal data ID<1:K> read out of the second memory region 230b through the input/output line IO during the read operation. The second internal control circuit 240b may output the first to $K^{th}$ internal data ID<1:K> loaded on the input/output line IO to the second memory region 230b during the write operation. The second internal control circuit 240b may be realized using a general differential amplification circuit that senses and amplifies the first to $K^{th}$ internal data ID<1:K>. When the repair signal SPPR is inputted to the second internal control circuit 240b, the second internal control circuit 240b may control the second memory region 230b and the first repair region 250b to replace a failed word line, which is selected by the first to $M^{th}$ refresh address signals REF_ADD<1:M>, among the first to $N^{th}$ word lines WL<1:N> with any one of the third and fourth repair lines SR<3:4> included in the first repair region 250b. When the repair signal SPPR is inputted to the second internal control circuit 240b, the second internal control circuit 240b may copy the first to $K^{th}$ internal data ID<1:K> and may control the second memory region 230b and the first repair region 250b to store the copied first to $K^{th}$ internal data ID<1:K> into the third and fourth repair lines SR<3:4>.

The first repair region 250b may include the first to fourth repair lines SR<1:4>. The first and second repair lines SR<1:2> in the first repair region 250b may be used to replace word lines connected to failed memory cells included in the first memory region 210b. The third and fourth repair lines SR<3:4> in the first repair region 250b may be used to replace word lines connected to failed memory cells included in the second memory region 230b.

The third memory region 260b may also include first to $N^{th}$ word lines WL<1:N>. When the read signal RD is inputted to the third memory region 260b, the third memory region 260b may output the first to $K^{th}$ internal data ID<1:K> stored in memory cells connected to a word line, which is activated by the first to $M^{th}$ address signals ADD<1:M>, among the first to $N^{th}$ word lines WL<1:N>. When the write signal WT is inputted to the third memory region 260b, the third memory region 260b may store the first to $K^{th}$ internal data ID<1:K> into memory cells connected to a word line, which is activated by the first to $M^{th}$ address signals ADD<1:M>, among the first to $N^{th}$ word lines WL<1:N>. When the refresh signal REF is inputted to the third memory region 260b, the third memory region 260b may activate one or more word lines among the first to $N^{th}$ word lines WL<1:N> based on the first to $M^{th}$ refresh address signals REF_ADD<1:M>. When the repair signal SPPR is inputted to the third memory region 260b, the third memory region 260b may replace a failed word line, which is selected by the first to $M^{th}$ refresh address signals REF_ADD<1:M>, among the first to $N^{th}$ word lines WL<1:N> with any one of first and second repair lines SR<1:2> included in the second repair region 300b.

The third internal control circuit 270b may be electrically connected to the third memory region 260b and the second repair region 300b. The third internal control circuit 270b may output the first to $K^{th}$ internal data ID<1:K> read out of the third memory region 260b through the input/output line IO during the read operation. The third internal control circuit 270b may output the first to $K^{th}$ internal data ID<1:K> loaded on the input/output line IO to the third memory region 260b during the write operation. The third internal control circuit 270b may be realized using a general differential amplification circuit that senses and amplifies the first to $K^{th}$ internal data ID<1:K>. When the repair signal SPPR is inputted to the third internal control circuit 270b, the third internal control circuit 270b may control the third memory region 260b and the second repair region 300b to replace a failed word line, which is selected by the first to $M^{th}$ refresh address signals REF_ADD<1:M>, among the first to $N^{th}$ word lines WL<1:N> with any one of the first and second repair lines SR<1:2> included in the second repair region 300b. When the repair signal SPPR is inputted to the third internal control circuit 270b, the third internal control circuit 270b may copy the first to $K^{th}$ internal data ID<1:K> and may control the third memory region 260b and the second repair region 300b to store the copied first to $K^{th}$ internal data ID<1:K>) into the first and second repair lines SR<1:2> included in the second repair region 300b.

The fourth memory region 280b may also include first to $N^{th}$ word lines WL<1:N>. When the read signal RD is inputted to the fourth memory region 280b, the fourth memory region 280b may output the first to $K^{th}$ internal data ID<1:K> stored in memory cells connected to a word line, which is activated by the first to $M^{th}$ address signals ADD<1:M> among the first to $N^{th}$ word lines WL<1:N>. When the write signal WT is inputted to the fourth memory region 280b, the fourth memory region 280b may store the first to $K^{th}$ internal data ID<1:K> into memory cells connected to a word line, which is activated by the first to $M^{th}$ address signals ADD<1:M>, among the first to $N^{th}$ word lines WL<1:N>. When the refresh signal REF is inputted to the fourth memory region 280b, the fourth memory region 280b may activate one or more word lines among the first to $N^{th}$ word lines WL<1:N> based on the first to $M^{th}$ refresh address signals REF_ADD<1:M>. When the repair signal SPPR is inputted to the fourth memory region 280b, the fourth memory region 280b may replace a failed word line, which is selected by the first to $M^{th}$ refresh address signals REF_ADD<1:M>, among the first to N$^{th}$ word lines WL<1:N> with any one of third and fourth repair lines SR<3:4> included in the second repair region 300b.

The fourth internal control circuit 290b may be electrically connected to the fourth memory region 280b and the second repair region 300b. The fourth internal control circuit 290b may output the first to K$^{th}$ internal data ID<1:K> read out of the fourth memory region 280b through the input/output line IO during the read operation. The fourth internal control circuit 290b may output the first to K$^{th}$ internal data ID<1:K> loaded on the input/output line IO to the fourth memory region 280b during the write operation. The fourth internal control circuit 290b may be realized using a general differential amplification circuit that senses and amplifies the first to K$^{th}$ internal data ID<1:K>. When the repair signal SPPR is inputted to the fourth internal control circuit 290b, the fourth internal control circuit 290b may control the fourth memory region 280b and the second repair region 300b to replace a failed word line, which is selected by the first to M$^{th}$ refresh address signals REF_ADD<1:M>, among the first to N$^{th}$ word lines WL<1:N> with any one of the third and fourth repair lines SR<3:4> included in the second repair region 300b. When the repair signal SPPR is inputted to the fourth internal control circuit 290b, the fourth internal control circuit 290b may copy the first to K internal data ID<1:K> and may control the fourth memory region 280b and the second repair region 300b to store the copied first to K$^{th}$ internal data ID<1:K> into the third and fourth repair lines SR<3:4> included in the second repair region 300b.

The second repair region 300b may include the first to fourth repair lines SR<1:4>. The first and second repair lines SR<1:2> in the second repair region 300b may be used to replace word lines connected to failed memory cells included in the third memory region 260b. The third and fourth repair lines SR<3:4> in the second repair region 300b may be used to replace word lines connected failed memory cells included in the fourth memory region 280b.

Figure 9:
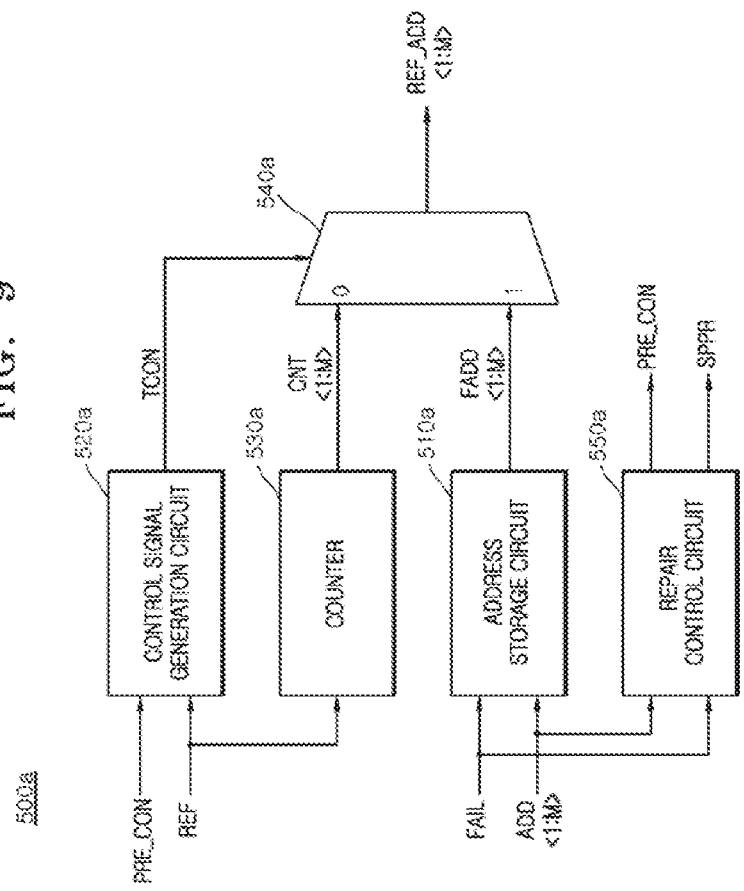
FIG. 9 is a block diagram illustrating a configuration of a refresh control circuit included in the semiconductor device illustrated in FIG. 6.

FIG. 9 is a block diagram illustrating a configuration of a refresh control circuit 500a corresponding to another example of the refresh control circuit 500 illustrated in FIG. 4. As illustrated in FIG. 9, the refresh control circuit 500a may include an address storage circuit 510a, a control signal generation circuit 520a, a counter 530a, a selection transmission circuit 540a, and a repair control circuit 550a.

The address storage circuit 510a may store the first to M$^{th}$ address signals ADD<1:M> based on the failure detection signal FAIL. The address storage circuit 510a may store the first to M$^{th}$ address signals ADD<1:M> inputted at a point in time when the failure detection signal FAIL is enabled. The address storage circuit 510a may output the first to M$^{th}$ address signals ADD<1:M>, which are stored at the point in time when the failure detection signal FAIL is enabled, as the first to M$^{th}$ failure address signals FADD<1:M>.

The control signal generation circuit 520a may generate a control signal TCON based on a pre-control signal PRE_CON and a refresh signal REF. The control signal generation circuit 520a may generate the control signal TCON that is enabled when the pre-control signal PRE_CON is inputted. The control signal generation circuit 520a may generate the control signal TCON that is enabled to have a logic "high" level when the pre-control signal PRE_CON has a logic "high" level. The control signal generation circuit 520a may generate the control signal TCON that is enabled when the refresh signal REF is inputted by a first predetermined number of times. For example, the control signal generation circuit 520a may generate the control signal TCON that is enabled to have a logic "high" level when the refresh signal REF is successively inputted twice or more.

The counter 530a may generate the first to M$^{th}$ counting signals CNT<1:M> based on the refresh signal REF. The counter 530a may generate the first to M$^{th}$ counting signals CNT<1:M> that are sequentially counted when the refresh signal REF is inputted.

The selection transmission circuit 540a may generate the first to M$^{th}$ refresh address signals REF_ADD<1:M> from the first to M$^{th}$ failure address signals FADD<1:M> or the first to M$^{th}$ counting signals CNT<1:M> based on the control signal TCON. When the control signal TCON is disabled to have a logic "low" level, the selection transmission circuit 540a may output the first to M$^{th}$ counting signals CNT<1:M> as the first to M$^{th}$ refresh address signals REF_ADD<1:M>. When the control signal TCON is enabled to have a logic "high" level, the selection transmission circuit 540a may output the first to M$^{th}$ failure address signals FADD<1:M> as the first to M$^{th}$ refresh address signals REF_ADD<1:M>.

The repair control circuit 550a may generate the pre-control signal PRE_CON that is enabled when the first to M$^{th}$ address signals ADD<1:M> having the same logic level combination are inputted by a second predetermined number of times in response to the failure detection signal FAIL. The repair control circuit 550a may generate the repair signal SPPR that is enabled when the first to M$^{th}$ address signals ADD<1:M> having the same logic level combination are inputted by a third predetermined number of times in response to the failure detection signal FAIL.

Figure 10:
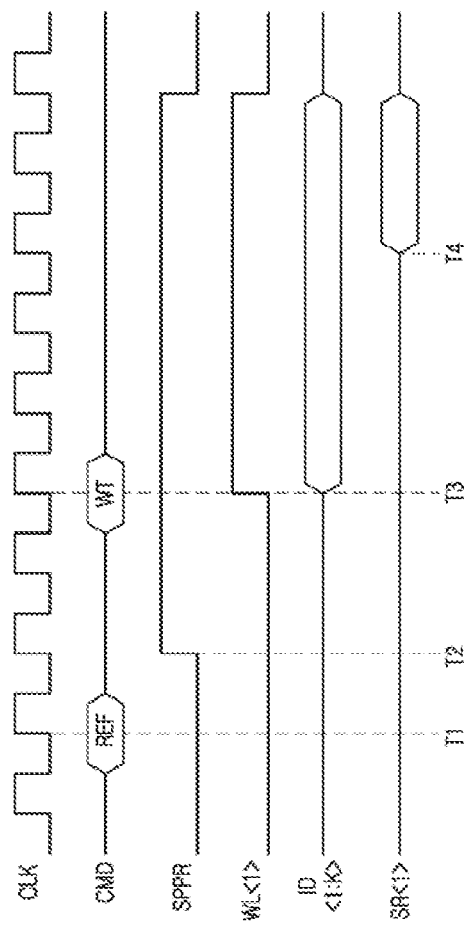
FIGS. 10 and 11 are timing diagrams illustrating an operation of a semiconductor system according to another embodiment of the present disclosure.

A repair operation performed during a refresh operation of the semiconductor device 20a will be described hereinafter with reference to FIG. 10 in conjunction with a case that errors repeatedly occur whenever the first word line WL<1> of the first memory region 210a is selected.

At a point in time T1, the command decoder 100a may be synchronized with the clock signal CLK to generate the refresh signal REF from the command signal CMD.

The address storage circuit 510a may output the first to M$^{th}$ address signals ADD<1:M>, which are stored at a point in time when the failure detection signal FAIL is enabled, as the first to M$^{th}$ failure address signals FADD<1:M>.

At a point in time T2, the repair control circuit 550a may generate the repair signal SPPR that is enabled to have a logic "high" level because the first to M$^{th}$ address signals ADD<1:M> having the same logic level combination are inputted by the third predetermined number of times in response to the failure detection signal FAIL.

The control signal generation circuit 520a may generate the control signal TCON that is enabled to have a logic "high" level based on the refresh signal REF.

The selection transmission circuit 540a may output the first to M$^{th}$ failure address signals FADD<1:M> as the first to M$^{th}$ refresh address signals REF_ADD<1:M> based on the control signal TCON having a logic "high" level.

At a point in time T3, the command decoder 100a may generate the write signal WT from the command signal CMD in synchronization with the clock signal CLK.

The first internal control circuit 220a may output the first to K$^{th}$ internal data ID<1:K> loaded on the input/output line IO to the first memory region 210a during the write operation. The first internal control circuit 220a may control the first memory region 210a to replace the first word line WL<1> corresponding to a failed word line, which is selected by the first to M$^{th}$ refresh address signals REF_ADD<1:M>, with the first repair line SR<1> in response to the repair signal SPPR having a logic "high" level.

At a point in time T4, the first memory region 210a may replace the failed first word line WL<1> with the first repair line SR<1> based on the repair signal SPPR having a logic "high" level and the first to $M^{th}$ refresh address signals REF_ADD<1:M>.

The first internal control circuit 220a may copy the first to $K^{th}$ internal data ID<1:K> inputted at the point in time T3 and may store the copied internal data into memory cells connected to the first repair line SR<1>.

As described above, the semiconductor system 1 according to an embodiment of the present disclosure may improve the reliability of internal data by replacing a failed word line connected to failed memory cells with a repair line when an address signal for selecting the failed memory cells storing failed internal data is inputted by a third predetermined number of times during a refresh operation.

Figure 11:
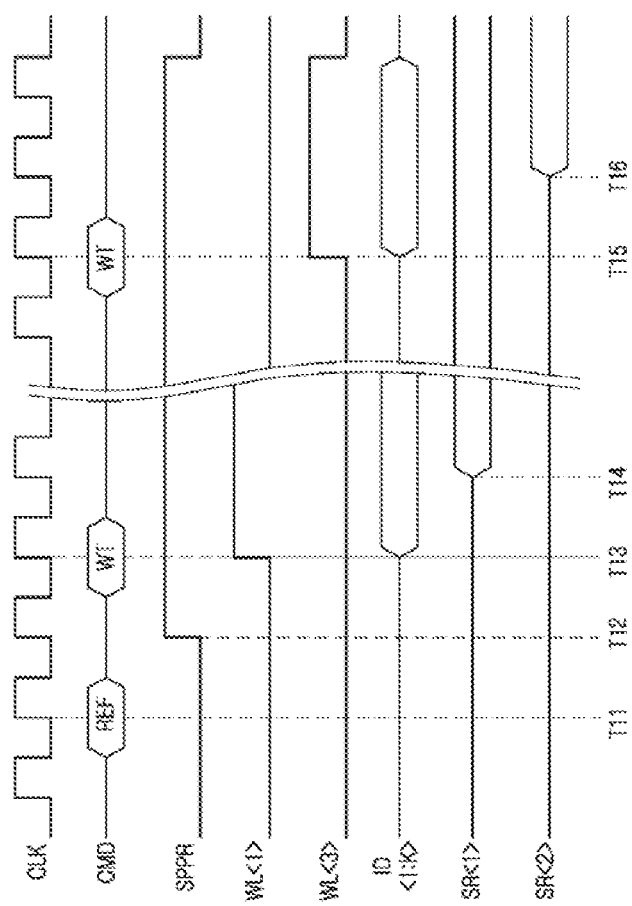

A repair operation performed during a refresh operation of the semiconductor device 20b will be described hereinafter with reference to FIG. 11 in conjunction with a case that errors repeatedly occur whenever the first word line WL<1> of the first memory region 210b and the third word line WL<3> of the second memory region 230b are selected.

At a point in time T11, the command decoder 100a may generate the refresh signal REF from the command signal CMD in synchronization with the clock signal CLK.

The address storage circuit 510a may output the first to $M^{th}$ address signals ADD<1:M>, which are stored at a point in time when the failure detection signal FAIL is enabled, as the first to $M^{th}$ failure address signals FADD<1:M>.

At a point in time T12, the repair control circuit 550a may generate the repair signal SPPR that is enabled to have a logic "high" level because the first to $M^{th}$ address signals ADD<1:M> having the same logic level combination are inputted by the third predetermined number of times in response to the failure detection signal FAIL.

The control signal generation circuit 520a may generate the control signal TCON that is enabled to have a logic "high" level based on the refresh signal REF.

The selection transmission circuit 540a may output the first to $M^{th}$ failure address signals FADD<1:M> as the first to $M^{th}$ refresh address signals REF_ADD<1:M> based on the control signal TCON having a logic "high" level.

At a point in time T13, the command decoder 100a may generate the write signal WT from the command signal CMD in synchronization with the clock signal CLK.

The first internal control circuit 220b may output the first to $K^{th}$ internal data ID<1:K> loaded on the input/output line IO to the first memory region 210b during the write operation. The first internal control circuit 220b may control the first memory region 210b to replace the failed first word line WL<1>, which is selected by the first to $M^{th}$ refresh address signals REF_ADD<1:M>, with the first repair line SR<1> in response to the repair signal SPPR having a logic "high" level.

At a point in time T14, the first memory region 210b may replace the failed first word line WL<1> with the first repair line SR<1> based on the repair signal SPPR having a logic "high" level and the first to $M^{th}$ refresh address signals REF_ADD<1:M>.

The first internal control circuit 220b may copy the first to $K^{th}$ internal data ID<1:K> inputted at the point in time T13 and may store the copied internal data into memory cells connected to the first repair line SR<1>.

At a point in time T15, the command decoder 100a may generate the write signal WT from the command signal CMD in synchronization with the clock signal CLK.

The second internal control circuit 240b may output the first to $K^{th}$ internal data ID<1:K> loaded on the input/output line IO to the second memory region 230b during the write operation. The second internal control circuit 240b may control the second memory region 230b to replace the failed third word line WL<3> with the second repair line SR<2> based on the repair signal SPPR having a logic "high" level and the first to $M^{th}$ refresh address signals REF_ADD<1:M>.

At a point in time T16, the second memory region 230b may replace the failed third word line WL<3> with the second repair line SR<2> based on the repair signal SPPR having a logic "high" level and the first to $M^{th}$ refresh address signals REF_ADD<1:M>.

The second internal control circuit 240b may copy the first to $K^{th}$ internal data ID<1:K> inputted at the point in time T15 and may store the copied internal data into memory cells connected to the second repair line SR<2>.

An error correction method of the semiconductor system 1 according to an embodiment of the present disclosure may improve the reliability of internal data by replacing a failed word line connected to failed memory cells with a repair line when an address signal for selecting the failed memory cells storing failed internal data is inputted by a third predetermined number of times during a refresh operation.

Figure 12:
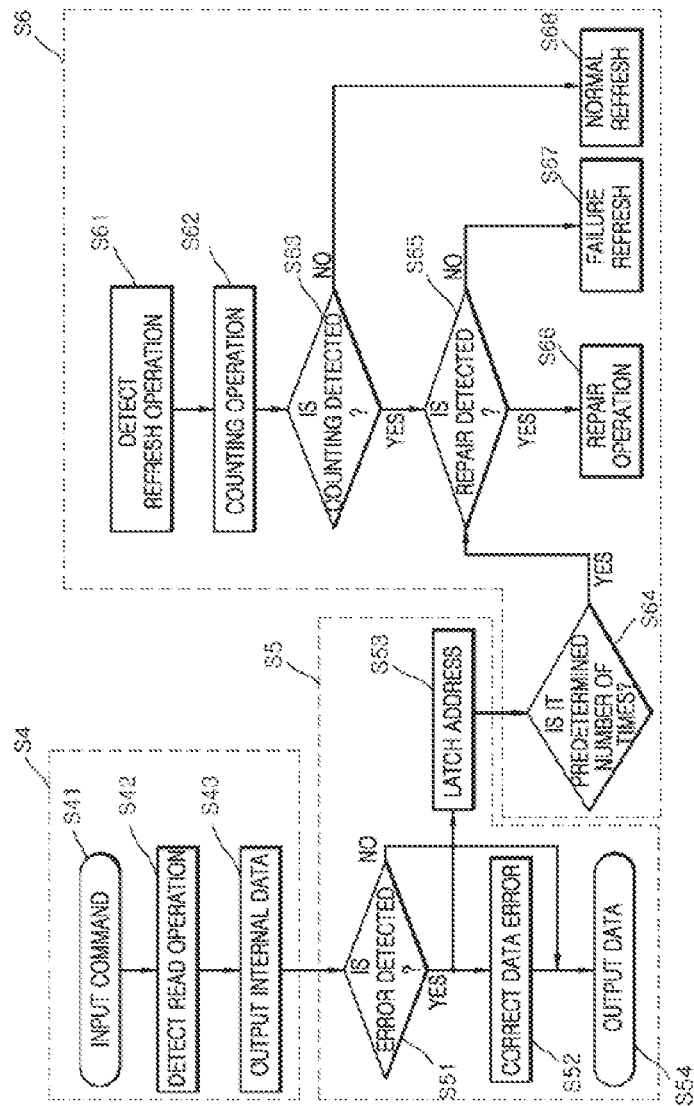
FIG. 12 is a flowchart illustrating an error correction method of a semiconductor system according to another embodiment of the present disclosure.

An error correction method of a semiconductor system according to another embodiment of the present disclosure will be described hereinafter with reference to FIG. 12.

The error correction method may include a read operation step S4, an error correction step S5, and a refresh step S6.

The read operation step S4 may include a command input step S41, a read operation detection step S42, and an internal data output step S43.

The command input step S41 may correspond to a step of transmitting the clock signal CLK, the command signal CMD, and the first to $M^{th}$ address signals ADD<1:M> for performing the read operation from the controller 10 to the semiconductor device 20a.

The read operation detection step S42 may correspond to a step of generating the read signal RD based on the clock signal CLK and the command signal CMD outputted from the controller 10.

The internal data output step S43 may correspond to a step of outputting the first to $K^{th}$ internal address signals ID<1:K> stored in the core circuit 200a to the input/output line IO based on the read signal RD and the first to $M^{th}$ address signals ADD<1:M>.

The error correction step S5 may include an error detection step S51, a data error correction step S52, an address latching step S53, and a data output step S54.

The error detection step S51 may correspond to a step of detecting an error of the first to $K^{th}$ internal data ID<1:K> loaded on the input/output line IO by using the error correction circuit 400a. When an error exists in the first to $K^{th}$ internal data ID<1:K> at the error detection step S51 (YES), the error correction circuit 400a may generate the failure detection signal FAIL. The refresh control circuit 500a may store the first to $M^{th}$ address signals ADD<1:M> based on the failure detection signal FAIL. When no error exists in the first to $K^{th}$ internal data ID<1:K> at the error detection step S51 (NO), the data output step S54 may be performed.

The data error correction step S52 may correspond to a step of correcting an error of the first to $K^{th}$ internal data ID<1:K> using an error correction code (ECC) in the error correction circuit 400a.

The address latching step S53 may correspond to a step of storing the first to $M^{th}$ address signals ADD<1:M> as the first to $M^{th}$ failure address signals FADD<1:M> in the refresh control circuit 500a when the failure detection signal FAIL is enabled.

The data output step S54 may correspond to a step of generating the first to $K^{th}$ data DATA<1:K> by buffering the first to $K^{th}$ internal data ID<1:K>, which is corrected at the data error correction step S52, in the data input/output circuit 300a. The data output step S54 may also correspond to a step of outputting the first to $K^{th}$ data DATA<1:K> generated by the data input/output circuit 300a to the controller 10.

The refresh step S6 may include a refresh operation detection step S61, a counting operation step S62, a counting detection step S63, a predetermined number of times detection step S64, a repair detection step S65, a repair operation step S66, a failure refresh step S67, and a normal refresh step S68.

The refresh operation detection step S61 may correspond to a step of generating the refresh signal REF based on the clock signal CLK and the command signal CMD outputted from the controller 10.

The counting operation step S62 may correspond to a step of detecting the refresh signal REF whenever the refresh signal REF is inputted to the refresh control circuit 500a.

The counting detection step S63 may correspond to a step of detecting whether the refresh signal REF is inputted to the refresh control circuit 500a by the first predetermined number of times.

When the refresh signal REF is inputted to the refresh control circuit 500a by the first predetermined number of times at the counting detection step S63 (YES), the repair detection step S65 may be performed.

The predetermined number of times detection step S64 may correspond to a step of detecting whether the first to $K^{th}$ internal data ID<1:K> including an error at the address latching step S53 are inputted by the second predetermined number of times.

When the first to K internal data ID<1:K> including an error are inputted by the second predetermined number of times at the predetermined number of times detection step S64 (YES), the repair detection step S65 may be performed.

When the refresh signal REF is inputted to the refresh control circuit 500a by the first predetermined number of times or more at the counting detection step S63 (YES), the repair detection step S65 may be performed. When the refresh signal REF is inputted to the refresh control circuit 500a by the number of times less than the first predetermined number of times at the counting detection step S63 (NO), the normal refresh step S68 may be performed.

The repair detection step S65 may correspond to a step of detecting whether the first to $K^{th}$ internal data ID<1:K> including an error are inputted by the third predetermined number of times. When the first to $K^{th}$ internal data ID<1:K> including an error are inputted by the third predetermined number of times (YES) at the repair detection step S65, the repair operation step S66 may be performed.

The repair operation step S66 may perform the repair operation of replacing a word line connected to memory cells storing the first to $K^{th}$ internal data ID<1:K> including an error with a repair line in the core circuit 200a.

When the first to $K^{th}$ internal data ID<1:K> including an error are not inputted by the third predetermined number of times (NO) at the repair detection step S65, the failure refresh step S67 may be performed.

The failure refresh step S67 may correspond to a step of generating the first to $M^{th}$ refresh address signals REF_ADD<1:M> for activating a word line, which is connected to memory cells storing the first to $K^{th}$ internal data ID<1:K> including an error, from the first to $M^{th}$ address signals ADD<1:M> in the refresh control circuit 500a. The failure refresh step S67 may correspond to a step of performing the refresh operation by additionally activating the failed word line, which is selected by the first to $M^{th}$ refresh address signals REF_ADD<1:M>, in the core circuit 200a.

The normal refresh step S68 may correspond to a step of generating the first to $M^{th}$ refresh address signals REF_ADD<1:M>, which are sequentially enabled to sequentially activate multiple word lines included in the core circuit 220a, in the refresh control circuit 500a. The normal refresh step S68 may correspond to a step of performing the refresh operation by sequentially activating the multiple word lines in the core circuit 200a based on the refresh signal REF and the first to $M^{th}$ refresh address signals REF_ADD<1:M> which are sequentially counted.

An error correction method of the semiconductor system 1 according to another embodiment of the present disclosure may improve the reliability of internal data by replacing a failed word line connected to failed memory cells with a repair line when an address signal for selecting the failed memory cells storing failed internal data is inputted by a third predetermined number of times during a refresh operation.

As described above with reference to FIGS. 1 to 12, an error correction method according to an embodiment of the present disclosure and the semiconductor device and semiconductor system used in the error correction method may improve the reliability of internal data by additionally refreshing a word line connected to failed memory cells storing erroneous internal data when a refresh signal is repeatedly inputted by a first predetermined number of times during a refresh operation. The error correction method and the semiconductor device and semiconductor system used in the error correction method may improve the reliability of internal data by additionally refreshing a word line connected to failed memory cells storing erroneous internal data when an address signal for selecting the failed memory cells is inputted by a second predetermined number of times during the refresh operation. The error correction method and the semiconductor device and semiconductor system used in the error correction method may improve the reliability of internal data by replacing a word line connected to the failed memory cells with a repair line when an address signal for selecting the failed memory cells is inputted by a third predetermined number of times during the refresh operation.

Figure 13:
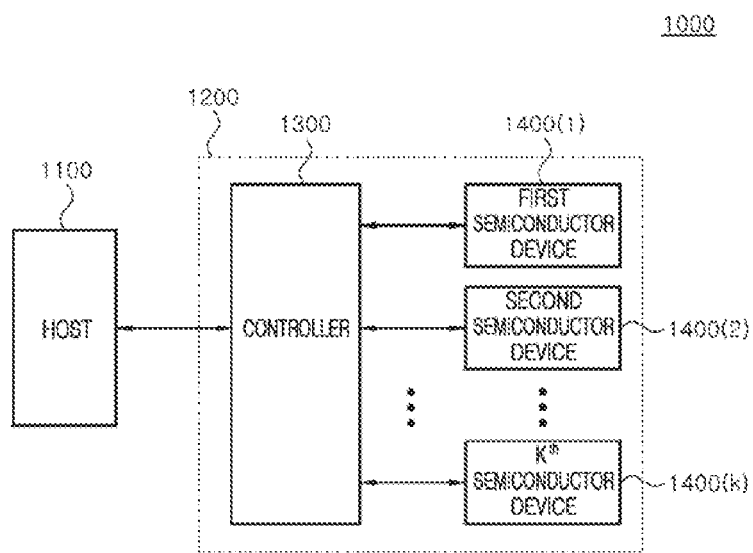
FIG. 13 is a diagram illustrating a configuration of an electronic system employing at least one of the semiconductor systems illustrated in FIGS. 1 to 12.

FIG. 13 is a block diagram illustrating a configuration of an electronic system 1000 according to an embodiment of the present disclosure. As illustrated in FIG. 13, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that the semiconductor devices 1400(K:1) perform the read operation, the write operation, the refresh operation, and the repair operation. Each of the semiconductor devices 1400(K:1) may improve the reliability of internal data by additionally refreshing a word line connected to failed memory cells storing erroneous internal data when a refresh signal is repeatedly inputted by a first predetermined number of times during a refresh operation. Each of the semiconductor devices 1400(K:1) may improve the reliability of internal data by additionally refreshing a word line connected to failed memory cells storing erroneous internal data when an address signal for selecting the failed memory cells is inputted by a second predetermined number of times during the refresh operation. Each of the semiconductor devices 1400(K:1) may improve the reliability of internal data by replacing a word line connected to the failed memory cells with a repair line when an address signal for selecting the failed memory cells is inputted by a third predetermined number of times during the refresh operation.

The controller 1300 may be realized using the controller illustrated in FIG. 1. Each of the semiconductor devices 1400(K:1) may be realized using the semiconductor device 20 illustrated in FIGS. 1 and 2. In some embodiments, each of the semiconductor devices 1400(K:1) may be realized using any one of a dynamic random access memory (DRAM), a phase change random access memory (PRAM), a resistive random access memory (RRAM), a magnetic random access memory (MRAM), and a ferroelectric random access memory (FRAM).

What is claimed is:

1. A semiconductor device comprising:
   an error correction circuit configured to detect an error included in internal data, to generate a failure detection signal, and to correct the error of the internal data; and
   a refresh control circuit configured to store an address signal for selecting the internal data in response to the failure detection signal and configured to generate a refresh address signal for activating a word line connected to memory cells storing the internal data from the address signal when a refresh signal is inputted to the refresh control circuit by a predetermined number of times,
   wherein the refresh control circuit comprises:
   an address storage circuit configured to latch the address signal to generate a failure address signal from the latched address signal when the failure detection signal is enabled;
   a control signal generation circuit configured to generate a control signal that is enabled when the refresh signal is inputted by the predetermined number of times;
   a counter configured to generate a counting signal that is sequentially counted in response to the refresh signal; and
   a selection transmission circuit configured to generate the refresh address signal from one of the failure address signal and the counting signal based on the control signal.

2. The semiconductor device of claim 1, wherein the error correction circuit is configured to enable the failure detection signal when the error exists in the internal data.

3. The semiconductor device of claim 1, wherein the refresh address signal is sequentially counted when the refresh signal is inputted to the refresh control circuit.

4. The semiconductor device of claim 1, further comprising:
   a core circuit configured to output the internal data stored in the core circuit to an input/output line based on a read signal and the address signal and configured to perform a refresh operation for activating a word line connected to memory cells storing the internal data based on the refresh address signal; and
   a data input/output circuit configured to generate data from the internal data loaded on the input/output line and to output the data.

5. The semiconductor device of claim 4, wherein the error correction circuit is configured to correct the error of the internal data loaded on the input/output line to output the corrected internal data to the input/output line.

6. A semiconductor device comprising:
   a core circuit configured to output internal data stored in memory cells connected to a word line selected by an address signal in response to a read signal and configured to replace a failed word line connected to at least one failed memory cell storing failed internal data with a repair line in response to a repair signal;
   an error correction circuit configured to detect an error included in the failed internal data to generate a failure detection signal and configured to correct the error of the failed internal data; and
   a refresh control circuit configured to generate the repair signal in response to the failure detection signal when the address signal for selecting the failed internal data is inputted by a first predetermined number of times.

7. The semiconductor device of claim 6, wherein the first predetermined number of times is the number of times when the address signal having a logic level combination for selecting the failed internal data is inputted at least three times.

8. The semiconductor device of claim 6, wherein the core circuit is configured to copy the internal data inputted in response to the repair signal during a write operation and to store the copied internal data into memory cells connected to the repair line.

9. The semiconductor device of claim 6, wherein the core circuit includes:
   a memory region including multiple word lines and multiple repair lines; and
   an internal control circuit configured to control an operation that copies the internal data to store the copied internal data into memory cells connected to the repair line in response to the repair signal during a write operation.

10. The semiconductor device of claim 9, wherein the multiple word lines are activated based on the address signal or a refresh address signal in response to a read signal and a write signal.

11. The semiconductor device of claim 6, wherein the core circuit includes:
    a memory region including multiple word lines;
    a repair region including multiple repair lines; and
    an internal control circuit configured to control an operation that copies the internal data to store the copied internal data into memory cells connected to the repair line in response to the repair signal during a write operation.

12. The semiconductor device of claim 6, wherein the refresh control circuit is configured to latch the address signal for selecting the internal data in response to the failure detection signal and configured to generate a refresh address signal for activating a word line connected to memory cells storing the internal data from the latched address signal when a refresh signal is inputted by a second predetermined number of times.

13. The semiconductor device of claim 12, wherein the second predetermined number of times is the number of times when the refresh signal is inputted at least twice.

14. The semiconductor device of claim 6, wherein the refresh control circuit includes:
    an address storage circuit configured to latch the address signal to generate a failure address signal from the latched address signal when the failure detection signal is enabled;
    a control signal generation circuit configured to generate a control signal that is enabled when the refresh signal is inputted by second predetermined number of times or when a pre-control signal is inputted;
    a counter configured to generate a counting signal sequentially counted in response to the refresh signal;
    a selection transmission circuit configured to generate the refresh address signal from one of the failure address signal and the counting signal based on the control signal; and
    a repair control circuit configured to generate the repair signal that is enabled in response to the failure detection signal when the address signal having a certain logic level combination is inputted by a first predetermined number of times and configured to generate the pre-control signal that is enabled in response to the failure detection signal when the address signal having the certain logic level combination is inputted by a second predetermined number of times.

15. An error correction method comprising:
    a read operation step comprising outputting internal data stored in a core circuit to an input/output line based on an address signal during a read operation;
    an error correction step comprising detecting an error of the internal data, latching the address signal according to the detection result of the error of the internal data, and correcting the error of the internal data to output the corrected internal data as data; and
    a refresh step comprising generating a refresh address signal from the address signal to refresh memory cells connected to a word line selected by the refresh address signal when a refresh signal is inputted by a predetermined number of times during a refresh operation.

16. The error correction method of claim 15, wherein the refresh address signal is sequentially counted when the refresh signal is inputted.

17. The error correction method of claim 15, wherein the refresh address signal is generated from the latched address signal when the refresh signal is inputted by a first predetermined number of times.

18. The error correction method of claim 15, wherein the error correction step comprises:
    an error detection step comprising detecting the error of the internal data;
    a data correction step comprising correcting the error of the internal data when the error exists in the internal data;
    an address latching step comprising storing the address signal as a failure address signal when the error exists in the internal data; and
    a data output step comprising correcting the error of the internal data to output the corrected internal data as the data.

19. The error correction method of claim 15, wherein the refresh step comprising:
    a counting operation step comprising detecting the input number of times of the refresh signal;
    a counting detection step comprising generating a control signal when the refresh signal is inputted by a first predetermined number of times;
    a failure refresh step comprising performing a refresh operation by generating the refresh address signal from a failure address signal generated from the address signal based on the control signal; and
    a normal refresh step comprising performing the refresh operation by generating the refresh address signal from a counting signal that is counted when the refresh signal is inputted, based on the control signal.

20. An error correction method comprising:
    a read operation step comprising outputting internal data stored in a core circuit to an input/output line based on an address signal during a read operation;
    an error correction step comprising detecting an error of the internal data, latching the address signal according to the detection result of the error of the internal data, and correcting the error of the internal data to output the corrected internal data as data; and
    a refresh step comprising generating a refresh address signal from the latched address signal to refresh memory cells connected to a word line selected by the refresh address signal when the address signal for selecting the internal data having the error is inputted by a first predetermined number of times during a refresh operation and refreshing the word line again when the address signal for selecting the internal data having the error is inputted by a second predetermined number of times during the refresh operation.

21. The error correction method of claim 20, wherein the first predetermined number of times is the number of times when the refresh signal is inputted at least twice.

22. The error correction method of claim 20, wherein the second predetermined number of times is the number of times when the address signal having a logic level combination for selecting the internal data having the error is inputted twice.

23. The error correction method of claim 20, wherein the refresh step comprises copying the internal data inputted during a write operation to replace a word line connected memory cells for storing the internal data having the error with a repair line when the address signal for selecting the internal data having the error is inputted by a third predetermined number of times.

24. The error correction method of claim 23, wherein the third predetermined number of times is the number of times when the address signal having a logic level combination for selecting the internal data having the error is inputted at least three times.

25. The error correction method of claim 20, wherein the refresh address signal is sequentially counted when the refresh signal is inputted.

26. The error correction method of claim 20, wherein the refresh address signal is generated from the latched address signal when the refresh signal is inputted by the first predetermined number of times or the second predetermined number of times.

27. The error correction method of claim 20, wherein the error correction step comprising:

an error detection step comprising detecting the error of the internal data;

a data correction step comprising correcting the error of the internal data when the error exists in the internal data;

an address latching step comprising storing the address signal as a failure address signal when the error exists in the internal data; and a data output step comprising correcting the error of the internal data to output the corrected internal data as the data.

28. The error correction method of claim 20, wherein the refresh step comprising:

a counting operation step comprising detecting the input number of times of the refresh signal;

a counting detection step comprising generating a control signal when the refresh signal is inputted by the first predetermined number of times or the second predetermined number of times;

a repair detection step comprising generating a pre-control signal that is enabled when the address signal for selecting the internal data having the error is inputted by the second predetermined number of times and generating a repair signal when the address signal for selecting the internal data having the error is inputted by a third predetermined number of times a repair operation step comprising replacing a word line connected to memory cells storing the internal data having the error with a repair line based on the repair signal;

a failure refresh step comprising performing a refresh operation by generating the refresh address signal from a failure address signal generated from the address signal based on the control signal or the pre-control signal; and a normal refresh step comprising performing the refresh operation by generating the refresh address signal from a counting signal that is counted when the refresh signal is inputted, based on the control signal.

\* \* \* \* \*